(12) United States Patent
Cha et al.

(10) Patent No.: US 10,573,356 B2
(45) Date of Patent: Feb. 25, 2020

(54) SEMICONDUCTOR MEMORY DEVICES, MEMORY SYSTEMS AND METHODS OF OPERATING SEMICONDUCTOR MEMORY DEVICES

(71) Applicant: SAMSUNG ELECTRONICS CO., LTD., Suwon-si, Gyeonggi-Do (KR)

(72) Inventors: Sang-Uhn Cha, Yongin-si (KR); Young-Hun Seo, Hwaseong-si (KR); Kwang-Il Park, Yongin-si (KR); Seung-Jun Bae, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 116 days.

(21) Appl. No.: 15/851,197

(22) Filed: Dec. 21, 2017

(65) Prior Publication Data

US 2018/0358060 A1 Dec. 13, 2018

(30) Foreign Application Priority Data

Jun. 9, 2017 (KR) .......................... 10-2017-0072223

(51) Int. Cl.
| | |
|---|---|
| *G06F 11/00* | (2006.01) |
| *G11C 7/10* | (2006.01) |
| *G11C 11/4093* | (2006.01) |
| *G11C 11/4096* | (2006.01) |
| *H03M 13/00* | (2006.01) |
| *G06F 11/10* | (2006.01) |

(52) U.S. Cl.
CPC ........ *G11C 7/1006* (2013.01); *G06F 11/1044* (2013.01); *G11C 7/106* (2013.01); *G11C 7/1087* (2013.01); *G11C 11/4093* (2013.01); *G11C 11/4096* (2013.01); *H03M 13/611* (2013.01)

(58) Field of Classification Search
None
See application file for complete search history.

(56) References Cited

U.S. PATENT DOCUMENTS

| 5,901,298 A * | 5/1999 | Cummins ........... G06F 13/4243 |
| | | 710/313 |
| 8,065,589 B2 | 11/2011 | Iida |
| 8,132,086 B2 | 3/2012 | Park et al. |
| 8,402,326 B2 | 3/2013 | Singh |
| 8,402,339 B2 | 3/2013 | Kubo et al. |
| 9,013,921 B2 | 4/2015 | Miyamoto et al. |

(Continued)

*Primary Examiner* — Mujtaba M Chaudry
(74) *Attorney, Agent, or Firm* — F. Chau & Associates, LLC

(57) ABSTRACT

A semiconductor memory device includes a memory cell array, an error correction code (ECC) engine, an input/output (I/O) gating circuit and a control logic circuit. The memory cell array includes bank arrays, each of the bank arrays includes a first sub array and a second sub array, and each of the first sub array and the second sub array includes a normal cell region to store data bits and a parity cell region to store parity bits. The ECC engine generates the parity bits and corrects error bit. The I/O gating circuit is connected between the ECC engine and the memory cell array. The control logic circuit controls the I/O gating circuit to perform column access to the normal cell region according to a multiple of a burst length and to perform column access to the parity cell region according to a non-multiple of the burst length partially.

20 Claims, 26 Drawing Sheets

(56) References Cited

U.S. PATENT DOCUMENTS

| | | | |
|---|---|---|---|
| 9,086,957 B2* | 7/2015 | Cordero | G06F 11/2221 |
| 9,280,418 B2 | 3/2016 | Kao et al. | |
| 2009/0327800 A1* | 12/2009 | Kim | G06F 11/1044 |
| | | | 714/5.11 |
| 2010/0060310 A1* | 3/2010 | Laisne | H01L 25/0657 |
| | | | 326/10 |
| 2014/0245105 A1* | 8/2014 | Chung | G06F 11/1048 |
| | | | 714/763 |
| 2016/0042809 A1* | 2/2016 | Kim | G11C 29/42 |
| | | | 714/719 |
| 2016/0314041 A1 | 10/2016 | Cha et al. | |
| 2017/0109231 A1 | 4/2017 | Cha et al. | |

* cited by examiner

FIG. 10A

| DCA | IUPRT1 | | ILPRT11 | | ILPRT12 | |
|---|---|---|---|---|---|---|
| | CSL# | VD | CSL# | VD | CSL# | VD |
| 1 | 1 | 8b | 1 | 8b | 1 | 2b |
| 2 | 2 | 8b | 2 | 8b | 1 | 2b |
| 3 | 3 | 8b | 3 | 8b | 1 | 2b |
| 4 | 4 | 8b | 4 | 8b | 1 | 2b |
| 5 | 5 | 8b | 5 | 8b | 2 | 2b |
| 6 | 6 | 8b | 6 | 8b | 2 | 2b |
| 7 | 7 | 8b | 7 | 8b | 2 | 2b |
| 8 | 8 | 8b | 8 | 8b | 2 | 2b |
| 9 | 9 | 8b | 9 | 8b | 3 | 2b |
| 10 | 10 | 8b | 10 | 8b | 3 | 2b |
| 11 | 11 | 8b | 11 | 8b | 3 | 2b |
| 12 | 12 | 8b | 12 | 8b | 3 | 2b |
| 13 | 13 | 8b | 13 | 8b | 4 | 2b |
| 14 | 14 | 8b | 14 | 8b | 4 | 2b |
| 15 | 15 | 8b | 15 | 8b | 4 | 2b |
| 16 | 16 | 8b | 16 | 8b | 4 | 2b |

FIG. 10B

| DCA | IUPRT1 | | ILPRT11 | | ILPRT12 | |
|---|---|---|---|---|---|---|
| | CSL# | VD | CSL# | VD | CSL# | VD |
| 17 | 17 | 8b | 17 | 8b | 5 | 2b |
| 18 | 18 | 8b | 18 | 8b | 5 | 2b |
| 19 | 19 | 8b | 19 | 8b | 5 | 2b |
| 20 | 20 | 8b | 20 | 8b | 5 | 2b |
| 21 | 21 | 8b | 21 | 8b | 6 | 2b |
| 22 | 22 | 8b | 22 | 8b | 6 | 2b |
| 23 | 23 | 8b | 23 | 8b | 6 | 2b |
| 24 | 24 | 8b | 24 | 8b | 6 | 2b |
| 25 | 25 | 8b | 25 | 8b | 7 | 2b |
| 26 | 26 | 8b | 26 | 8b | 7 | 2b |
| 27 | 27 | 8b | 27 | 8b | 7 | 2b |
| 28 | 28 | 8b | 28 | 8b | 7 | 2b |
| 29 | 29 | 8b | 29 | 8b | 8 | 2b |
| 30 | 30 | 8b | 30 | 8b | 8 | 2b |
| 31 | 31 | 8b | 31 | 8b | 8 | 2b |
| 32 | 32 | 8b | 32 | 8b | 8 | 2b |

FIG. 10C

| DCA | IUPRT1 | | ILPRT11 | | ILPRT12 | |
|---|---|---|---|---|---|---|
| | CSL# | VD | CSL# | VD | CSL# | VD |
| 33 | 33 | 8b | 33 | 2b | 9 | 8b |
| 34 | 34 | 8b | 34 | 2b | 10 | 8b |
| 35 | 35 | 8b | 35 | 2b | 11 | 8b |
| 36 | 36 | 8b | 36 | 2b | 12 | 8b |
| 37 | 37 | 8b | 37 | 2b | 13 | 8b |
| 38 | 38 | 8b | 38 | 2b | 14 | 8b |
| 39 | 39 | 8b | 39 | 2b | 15 | 8b |
| 40 | 40 | 8b | 40 | 2b | 16 | 8b |
| 41 | 41 | 8b | 41 | 2b | 17 | 8b |
| 42 | 42 | 8b | 42 | 2b | 18 | 8b |
| 43 | 43 | 8b | 43 | 2b | 19 | 8b |
| 44 | 44 | 8b | 44 | 2b | 20 | 8b |
| 45 | 45 | 8b | 45 | 2b | 21 | 8b |
| 46 | 46 | 8b | 46 | 2b | 22 | 8b |
| 47 | 47 | 8b | 47 | 2b | 23 | 8b |
| 48 | 48 | 8b | 48 | 2b | 24 | 8b |

FIG. 10D

| DCA | IUPRT1 | | ILPRT11 | | ILPRT12 | |
|---|---|---|---|---|---|---|
| | CSL# | VD | CSL# | VD | CSL# | VD |
| 49 | 49 | 2b | 37 | 8b | 25 | 8b |
| 50 | 49 | 2b | 38 | 8b | 26 | 8b |
| 51 | 49 | 2b | 39 | 8b | 27 | 8b |
| 52 | 49 | 2b | 40 | 8b | 28 | 8b |
| 53 | 50 | 2b | 41 | 8b | 29 | 8b |
| 54 | 50 | 2b | 42 | 8b | 30 | 8b |
| 55 | 50 | 2b | 43 | 8b | 31 | 8b |
| 56 | 50 | 2b | 44 | 8b | 32 | 8b |
| 57 | 51 | 2b | 45 | 8b | 33 | 8b |
| 58 | 51 | 2b | 46 | 8b | 34 | 8b |
| 59 | 51 | 2b | 47 | 8b | 35 | 8b |
| 60 | 52 | 2b | 48 | 8b | 36 | 8b |
| 61 | 52 | 2b | 49 | 8b | 37 | 8b |
| 62 | 52 | 2b | 50 | 8b | 38 | 8b |
| 63 | 52 | 2b | 51 | 8b | 39 | 8b |
| 64 | 52 | 2b | 52 | 8b | 40 | 8b |

FIG. 14A

| DCA | IUPRT2 | | ILPRT2 | |
|---|---|---|---|---|
| | CSL# | VD | CSL# | VD |
| 1 | 1 | 8b | 1 | 4b |
| 2 | 2 | 8b | 1 | 4b |
| 3 | 3 | 8b | 2 | 4b |
| 4 | 4 | 8b | 2 | 4b |
| 5 | 5 | 8b | 3 | 4b |
| 6 | 6 | 8b | 3 | 4b |
| 7 | 7 | 8b | 4 | 4b |
| 8 | 8 | 8b | 4 | 4b |
| 9 | 9 | 8b | 5 | 4b |
| 10 | 10 | 8b | 5 | 4b |
| 11 | 11 | 8b | 6 | 4b |
| 12 | 12 | 8b | 6 | 4b |
| 13 | 13 | 8b | 7 | 4b |
| 14 | 14 | 8b | 7 | 4b |
| 15 | 15 | 8b | 8 | 4b |
| 16 | 16 | 8b | 8 | 4b |

FIG. 14B

| DCA | IUPRT2 | | ILPRT2 | |
|---|---|---|---|---|
| | CSL# | VD | CSL# | VD |
| 17 | 17 | 8b | 9 | 4b |
| 18 | 18 | 8b | 9 | 4b |
| 19 | 19 | 8b | 10 | 4b |
| 20 | 20 | 8b | 10 | 4b |
| 21 | 21 | 8b | 11 | 4b |
| 22 | 22 | 8b | 11 | 4b |
| 23 | 23 | 8b | 12 | 4b |
| 24 | 24 | 8b | 12 | 4b |
| 25 | 25 | 8b | 13 | 4b |
| 26 | 26 | 8b | 13 | 4b |
| 27 | 27 | 8b | 14 | 4b |
| 28 | 28 | 8b | 14 | 4b |
| 29 | 29 | 8b | 15 | 4b |
| 30 | 30 | 8b | 15 | 4b |
| 31 | 31 | 8b | 16 | 4b |
| 32 | 32 | 8b | 16 | 4b |

FIG. 14C

| DCA | IUPRT2 | | ILPRT2 | |
|---|---|---|---|---|
| | CSL# | VD | CSL# | VD |
| 33 | 33 | 4b | 17 | 8b |
| 34 | 33 | 4b | 18 | 8b |
| 35 | 34 | 4b | 19 | 8b |
| 36 | 34 | 4b | 20 | 8b |
| 37 | 35 | 4b | 21 | 8b |
| 38 | 35 | 4b | 22 | 8b |
| 39 | 36 | 4b | 23 | 8b |
| 40 | 36 | 4b | 24 | 8b |
| 41 | 37 | 4b | 25 | 8b |
| 42 | 37 | 4b | 26 | 8b |
| 43 | 38 | 4b | 27 | 8b |
| 44 | 38 | 4b | 28 | 8b |
| 45 | 39 | 4b | 29 | 8b |
| 46 | 39 | 4b | 30 | 8b |
| 47 | 40 | 4b | 31 | 8b |
| 48 | 40 | 4b | 32 | 8b |

FIG. 14D

| DCA | IUPRT2 | | ILPRT2 | |
|---|---|---|---|---|
| | CSL# | VD | CSL# | VD |
| 49 | 41 | 4b | 33 | 8b |
| 50 | 41 | 4b | 34 | 8b |
| 51 | 42 | 4b | 35 | 8b |
| 52 | 42 | 4b | 36 | 8b |
| 53 | 43 | 4b | 37 | 8b |
| 54 | 43 | 4b | 38 | 8b |
| 55 | 44 | 4b | 39 | 8b |
| 56 | 44 | 4b | 40 | 8b |
| 57 | 45 | 4b | 41 | 8b |
| 58 | 45 | 4b | 42 | 8b |
| 59 | 46 | 4b | 43 | 8b |
| 60 | 46 | 4b | 44 | 8b |
| 61 | 47 | 4b | 45 | 8b |
| 62 | 47 | 4b | 46 | 8b |
| 63 | 48 | 4b | 47 | 8b |
| 64 | 48 | 4b | 48 | 8b |

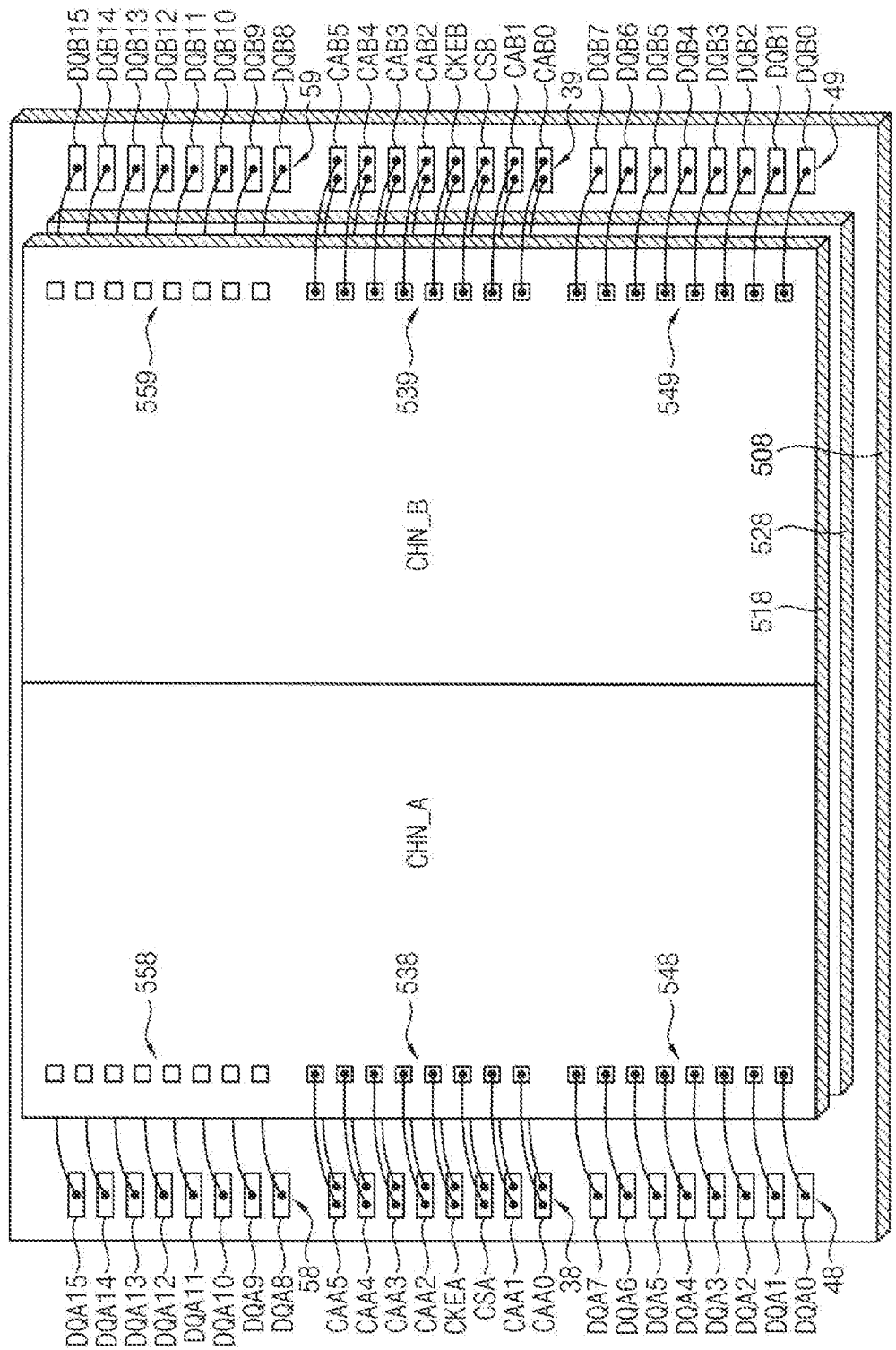

FIG. 16

| MEMORY DENSITY (PER DIE) | | 4Gb | 8Gb | 16Gb |
|---|---|---|---|---|
| MEMORY DENSITY (PER CHANNEL) | | 2Gb | 4Gb | 8Gb |
| BANK ADDRESS | | BA0-BA2 | BA0-BA2 | BA0-BA2 |
| X16 | ROW ADDRESS | R0-R13 | R0-R14 | R0-R15 |
| | COLUMN ADDRESS | C0-C9 | C0-C9 | C0-C9 |

FIG. 17

| COMMAND | CS | CA0 | CA1 | CA2 | CA3 | CA4 | CA5 | CK EDGE |
|---|---|---|---|---|---|---|---|---|
| ACT1 | H | H | L | R12 | R13 | R14 | R15 | R1 |
|  | L | BA0 | BA1 | BA2 | V | R10 | R11 | R2 |
| ACT2 | H | H | H | R6 | R7 | R8 | R9 | R1 |
|  | L | R0 | R1 | R2 | R3 | R4 | R5 | R2 |
| WR1 | H | L | L | H | L | L | BL | R1 |
|  | L | BA0 | BA1 | BA2 | V | C9 | AP | R2 |
| RD1 | H | L | H | L | L | L | BL | R1 |
|  | L | BA0 | BA1 | BA2 | V | C9 | AP | R2 |
| CAS2 | H | L | H | L | L | H | C8 | R1 |
|  | L | C2 | C3 | C4 | C5 | C6 | C7 | R2 |

SEMICONDUCTOR MEMORY DEVICES, MEMORY SYSTEMS AND METHODS OF OPERATING SEMICONDUCTOR MEMORY DEVICES

CROSS-REFERENCE TO RELATED APPLICATIONS

This US application claims the benefit of priority under 35 USC § 119 to Korean Patent Application No. 10-2017-0072223, filed on Jun. 9, 2017, in the Korean Intellectual Property Office, the disclosure of which is incorporated by reference in its entirety herein.

BACKGROUND

1. Technical Field

The present disclosure relates to memories, and more particularly to semiconductor memory devices, memory systems and methods of operating semiconductor memory devices.

2. Discussion of Related Art

Semiconductor memory devices may be classified into non-volatile memory devices such as flash memory devices and volatile memory devices such as dynamic random access memories (DRAMs). A non-volatile memory can retrieve stored information even after its power supply has been removed and a volatile memory needs constant power to prevent its data from being erased.

High speed operation and cost efficiency of DRAMs make it possible for DRAMs to be used as system memories. However, due to the continuing shrink in the fabrication design rule of DRAMs, bit errors of memory cells in the DRAMs may rapidly increase and yield of the DRAMs may decrease.

SUMMARY

At least one exemplary embodiment of the inventive concept may provide a semiconductor memory device having enhanced reliability and performance.

At least one exemplary embodiment of the inventive concept may provide a memory system having enhanced reliability and performance.

At least one exemplary embodiment of the inventive concept may provide a method of operating a semiconductor memory device to have enhanced reliability and performance According to an exemplary embodiment of the inventive concept, a semiconductor memory device includes a memory cell array, an error correction code (ECC) engine, an input/output (I/O) gating circuit and a control logic circuit. The memory cell array includes a plurality of bank arrays, each of the bank arrays includes a first sub array and a second sub array, and each of the first sub array and the second sub array includes a normal cell region to store data bits and a parity cell region to store parity bits associated with the data bits. The ECC engine generates the parity bits based on the data bits and corrects at least one error bit of the data bits using the parity bits. The I/O gating circuit is connected between the ECC engine and the memory cell array. The control logic circuit controls access to the memory cell array based on a command and an address. The control logic circuit controls the I/O gating circuit to perform column access to the normal cell region according to a multiple of a burst length and to perform column access to the parity cell region according to a non-multiple of the burst length partially, in response to the address.

According to exemplary embodiment of the inventive concept, a memory system includes at least one semiconductor memory device and a memory controller. The memory controller controls the at least one semiconductor memory device. The at least one semiconductor memory device includes a memory cell array, an error correction code (ECC) engine, an input/output (I/O) gating circuit and a control logic circuit. The memory cell array includes a plurality of bank arrays, each of the bank arrays includes a first sub array and a second sub array, and each of the first sub array and the second sub array includes a normal cell region to store data bits and a parity cell region to store parity bits associated with the data bits. The ECC engine generates the parity bits based on the data bits and corrects at least one error bit of the data bits using the parity bits. The I/O gating circuit is connected between the ECC engine and the memory cell array. The control logic circuit controls an access to the memory cell array based on a command and an address from the memory controller. The control logic circuit controls the I/O gating circuit to perform column access to the normal cell region according to a multiple of a burst length and to perform column access the parity cell region according to a non-multiple of the burst length partially, in response to the address.

According to an exemplary embodiment of the inventive concept, in a method of operating a semiconductor memory device including a memory cell array having a plurality of bank arrays, wherein each of the bank arrays includes a first sub array and a second sub array, and each of the first sub array and the second sub array includes a normal cell region to store data bits and a parity cell region to store parity bits associated with the data bits, the parity bits are generated based on the data bits, the data bits are stored in a first normal cell region of the first sub array and a second normal cell region of the second sub array, and the parity bits are stored in a first parity cell region of the first sub array and a second parity cell region of the second sub array while the data bits are being stored in the first normal cell region and the second normal cell region. A column access to the normal cell region is performed according to a multiple of a burst length and a column access to the parity cell region is performed partially according to a non-multiple of the burst length.

Accordingly, a column access to the normal cell region is performed according to a multiple of a burst length and a column access to the parity cell region is performed partially according to a non-multiple of the burst length. Therefore, when an ECC using parity bits whose number does not conform to a multiple of the burst length is employed, the semiconductor memory device may have enhanced performance and reliability by performing an ECC encoding and an ECC decoding using the ECC.

According to an exemplary embodiment of the inventive concept, a semiconductor memory device includes a memory cell array, an error correction code (ECC) engine, an input/output (I/O) gating circuit and a control logic circuit. The memory cell array includes a plurality of bank arrays, each of the bank arrays includes a first sub array and a second sub array, and each of the first sub array and the second sub array includes a normal cell region to store data bits and a parity cell region to store parity bits associated with the data bits. The ECC engine generates the parity bits based on the data bits and corrects at least one error bit of the data bits using the parity bits. The I/O gating circuit is connected between the ECC engine and the memory cell array. The control logic circuit controls access to the memory cell array based on a command and an address. The control logic circuit controls the I/O gating circuit to perform column access to the normal cell region according to a multiple of a burst length, controls the ECC engine to perform column access to the parity cell region according to a non-multiple of the burst length, in response to the address.

BRIEF DESCRIPTION OF THE DRAWINGS

Exemplary embodiments of the inventive concept will be described below in more detail with reference to the accompanying drawings.

FIGS. 10A through 10D illustrates a relationship between the internal column addresses and the column selection signals in each of the second, fourth and fifth switching circuits in FIG. 9.

FIGS. 14A through 14D illustrate a relationship between the internal column addresses and the column selection signals in each of the second and fourth switching circuits in FIG. 13.

FIG. 15 is a perspective view of a stacked memory chip according to an exemplary embodiment of the inventive concept.

FIG. 16 is a diagram for describing an addressing scheme of the stacked memory chip of FIG. 15.

FIG. 17 is a diagram illustrating a portion of commands in the stacked memory chip of FIG. 15.

DETAILED DESCRIPTION

The inventive concept will be described more fully hereinafter with reference to the accompanying drawings, in which exemplary embodiments thereof are shown.

Figure 1:
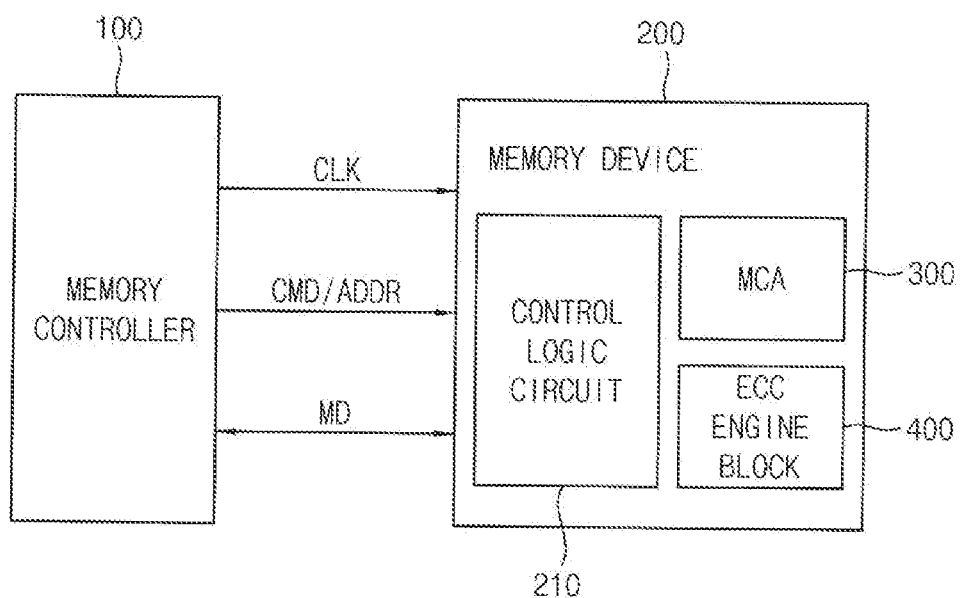
FIG. 1 is a block diagram illustrating a memory system according to an exemplary embodiment of the inventive concept.

FIG. 1 is a block diagram illustrating a memory system according to an exemplary embodiment of the inventive concept.

Referring to FIG. 1, a memory system 20 includes a memory controller 100 and a semiconductor memory device 200.

The memory controller 100 may control an overall operation of the memory system 20. The memory controller 100 may control an overall data exchange between an external host and the semiconductor memory device 200. For example, the memory controller 100 may write data in the semiconductor memory device 200 or read data from the semiconductor memory device 200 in response to a request from the host. The request may be sent as a message from the host to the semiconductor memory device 200.

In addition, the memory controller 100 may issue operation commands to the semiconductor memory device 200 for controlling the semiconductor memory device 200.

In some embodiments, the semiconductor memory device 200 is a memory device including dynamic memory cells such as a dynamic random access memory (DRAM), double data rate 4 (DDR4) synchronous DRAM (SRAM) or a low power DDR4 (LPDDR4) SRAM.

The memory controller 100 transmits a clock signal CLK, a command CMD and an address (signal) ADDR to the semiconductor memory device 200 and exchanges main data MD with the semiconductor memory device 200.

The semiconductor memory device 200 includes a memory cell array 300 that stores the main data MD, an error correction code (ECC) engine block 400 and a control logic circuit 210. The ECC engine block 400 may include a plurality of ECC engines corresponding to a plurality of bank arrays included in the memory cell array 300.

In an embodiment, each of the plurality of bank arrays includes a first sub array and a second sub array, and each of the first sub array and the second sub array includes a normal cell region to store data bits corresponding to the main data MD and a parity cell region to store parity bits generated based on the data bits.

In an embodiment, the control logic circuit 210 controls an input/output (I/O) gating circuit connected between the bank array and the ECC engine such that a column access operation on the normal cell region and the parity cell region is asymmetrically performed. The control logic circuit 210 may control the (I/O) gating circuit to perform the column access operation to the normal cell region according to a multiple of a burst length of the semiconductor memory device 200 and to perform a column access operation to the parity cell region according to a non-multiple of the burst length partially.

In an exemplary embodiment, a first data storage capacity of the normal cell region is different from a second data storage capacity of the parity cell region. In an exemplary embodiment, a first data storage capacity of a first parity cell region of the first sub array is different from a second data storage capacity of a second parity cell region of the second sub array. In an exemplary embodiment, a first data storage capacity of a first parity cell region of the first sub array is the same as a second data storage capacity of a second parity cell region of the second sub array.

Figure 2:
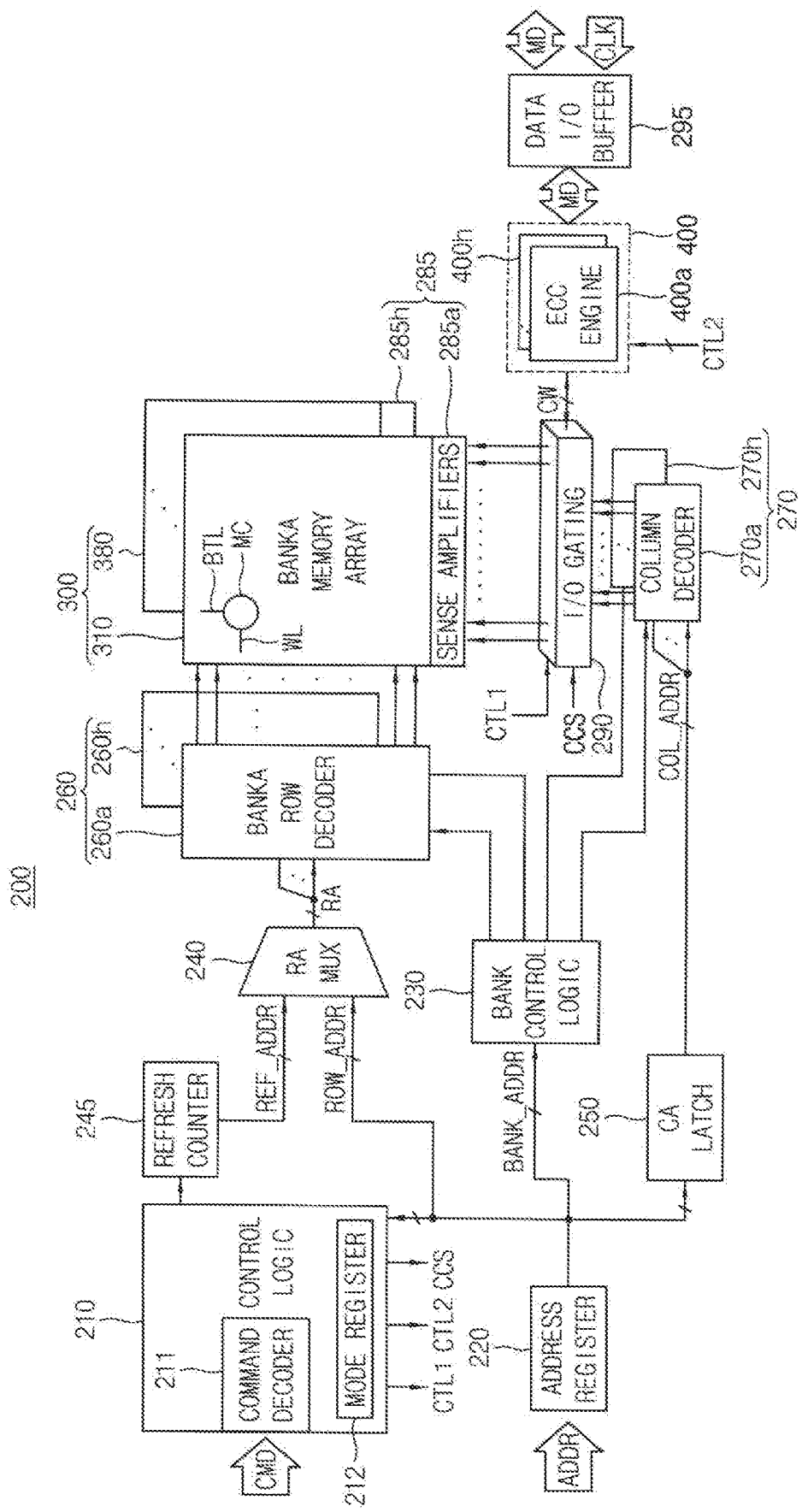
FIG. 2 is a block diagram illustrating the semiconductor memory device in FIG. 1 according to an exemplary embodiment of the inventive concept.

FIG. 2 is a block diagram illustrating the semiconductor memory device in FIG. 1 according to an exemplary embodiment of the inventive concept.

Referring to FIG. 2, the semiconductor memory device 200 includes a control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit block 290, the ECC engine block 400, and a data I/O buffer 295.

The ECC engine block 400 includes first through eighth ECC engines 400a~400h, and the I/O gating circuit block 290 includes a plurality of I/O gating circuits corresponding to a plurality of bank arrays. In alternate embodiments, the ECC engine block 400 may include less than eight ECC engines or more than eight ECC engines.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL. In alternate embodiments, there may be less than eight banks or more than eight banks.

The address register 220 receives an address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h, by the bank control logic 230, decodes the row address RA that is output from the row address multiplexer 240, and activates a word-line of a bank array corresponding to the row address RA. For example, the activated bank row decoder applies a word-line driving voltage to the word-line corresponding to the row address RA. The column address latch 250 receives the column address COL_ADDR from the address register 220, and temporarily stores the received column address COL_ADDR. In an exemplary embodiment, in a burst mode, the column address latch 250 generates column addresses that increment from the received column address COL_ADDR. For example, if the column address latch 250 is to receive 8 column addresses, rather than the column address latch 250 receiving them one at a time, the column address latch 250 receives only a start column address and calculates the other seven column addresses from the start address during the burst mode. The column address latch 250 applies the temporarily stored or generated column address to the first through eighth bank column decoders 270a~270h.

The activated one of the first through eighth bank column decoders 270a~270h activates a sense amplifier corresponding to the bank address BANK_ADDR and the column address COL_ADDR through the I/O gating circuit block 290. Each of the I/O gating circuits in the I/O gating circuit block 290 includes circuitry for gating input/output data, and further includes read data latches for storing data that is output from the first through eighth bank arrays 310~380, and write drivers for writing data to the first through eighth bank arrays 310~380.

A codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by a corresponding ECC engine. The main data MD to be written in one bank array of the first through eighth bank arrays 310~380 may be provided to the data I/O buffer 295 from the memory controller 100, and written in one bank array by the write drivers after an ECC encoding is performed on the main data MD by a corresponding ECC engine.

The data I/O buffer 295 may provide the main data MD from the memory controller 100 to the ECC engine block 400 in a write operation of the semiconductor memory device 200, based on the clock signal CLK and may provide the main data MD from the ECC engine block 400 to the memory controller 100 in a read operation of the semiconductor memory device 200.

In an embodiment, the ECC engine block 400, in the write operation, generates parity data (e.g., parity bits) based on the main data MD from the data I/O buffer 295, and provides the I/O gating circuit block 290 with the codeword CW including the main data MD and the parity bits. The I/O gating circuit block 290 may write the codeword CW in one bank array.

In addition, the ECC engine block 400, in the read operation, may receive the codeword CW, read from one bank array, from the I/O gating circuit block 290. The ECC engine block 400 may perform an ECC decoding on the main data MD based on the parity bits in the codeword CW, may correct a single bit error or double bit error in the main data MD and may provide corrected main data to the data I/O buffer 295.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes a command CMD received from the memory controller 100 and a mode register 212 that sets an operation mode of the semiconductor memory device 200. For example, a value of the mode register 212 may indicate the operation mode.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a column control signal CCS and a first control signal CTL1 to control the I/O gating circuit block 290 and a second control signal CTL2 to control the ECC engine block 400.

Figure 3:
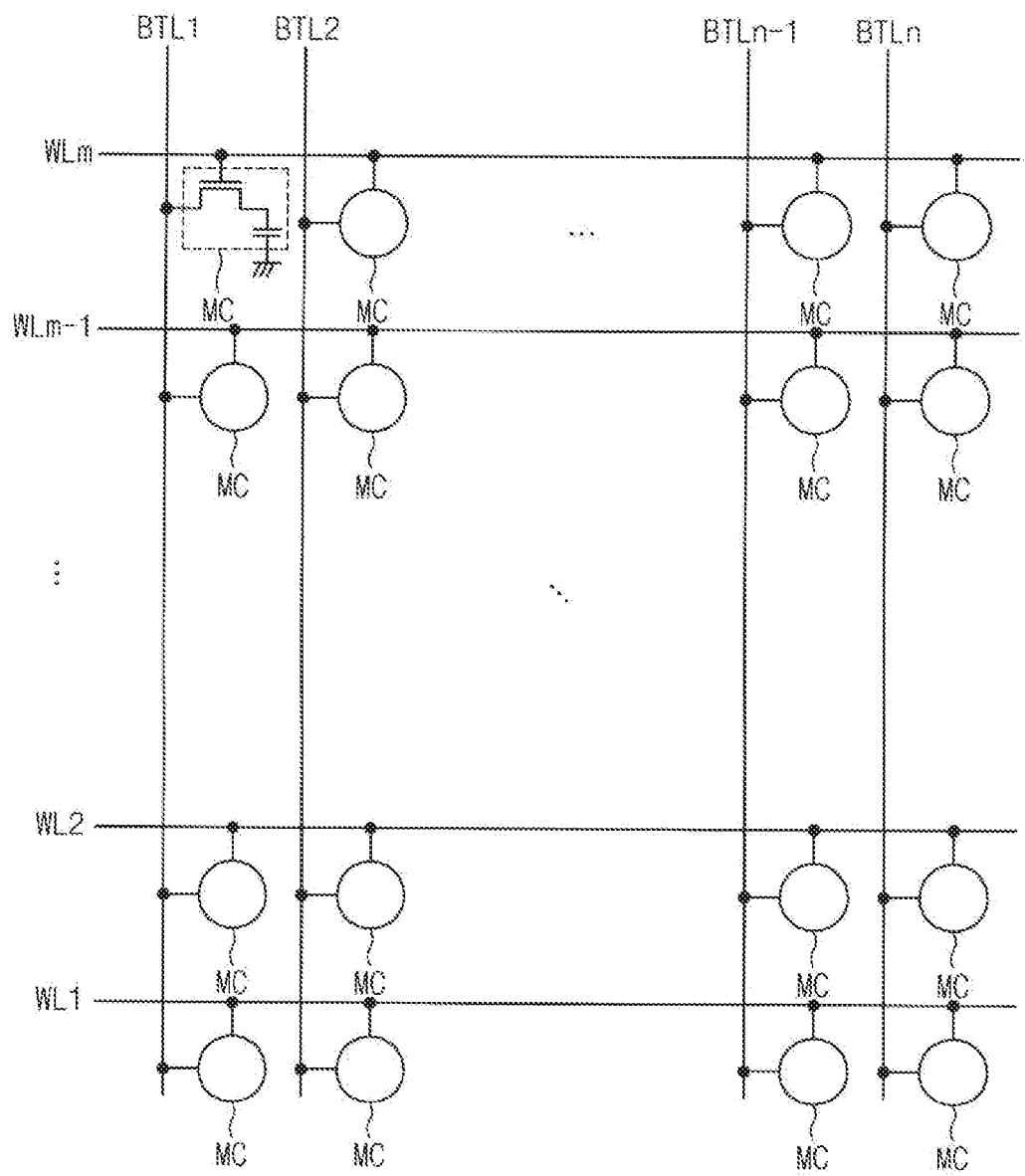
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 includes a plurality of word-lines WL1~WLm (m is a natural number greater than two), a plurality of bit-lines BTL1~BTLn (n is a natural number greater than two), and a plurality of memory cells MCs disposed at intersections between the word-lines WL1~WLm and the bit-lines BTL1~BTLn. In an embodiment, each of the memory cells MCs includes a cell transistor coupled to a corresponding one of the word-lines WL1~WLm and a corresponding one of the bit-lines BTL1~BTLn and a cell capacitor coupled to the cell transistor. Although not illustrated, the first bank array 310 includes a first sub array and a second sub array which are logically or physically separated.

Figure 4:
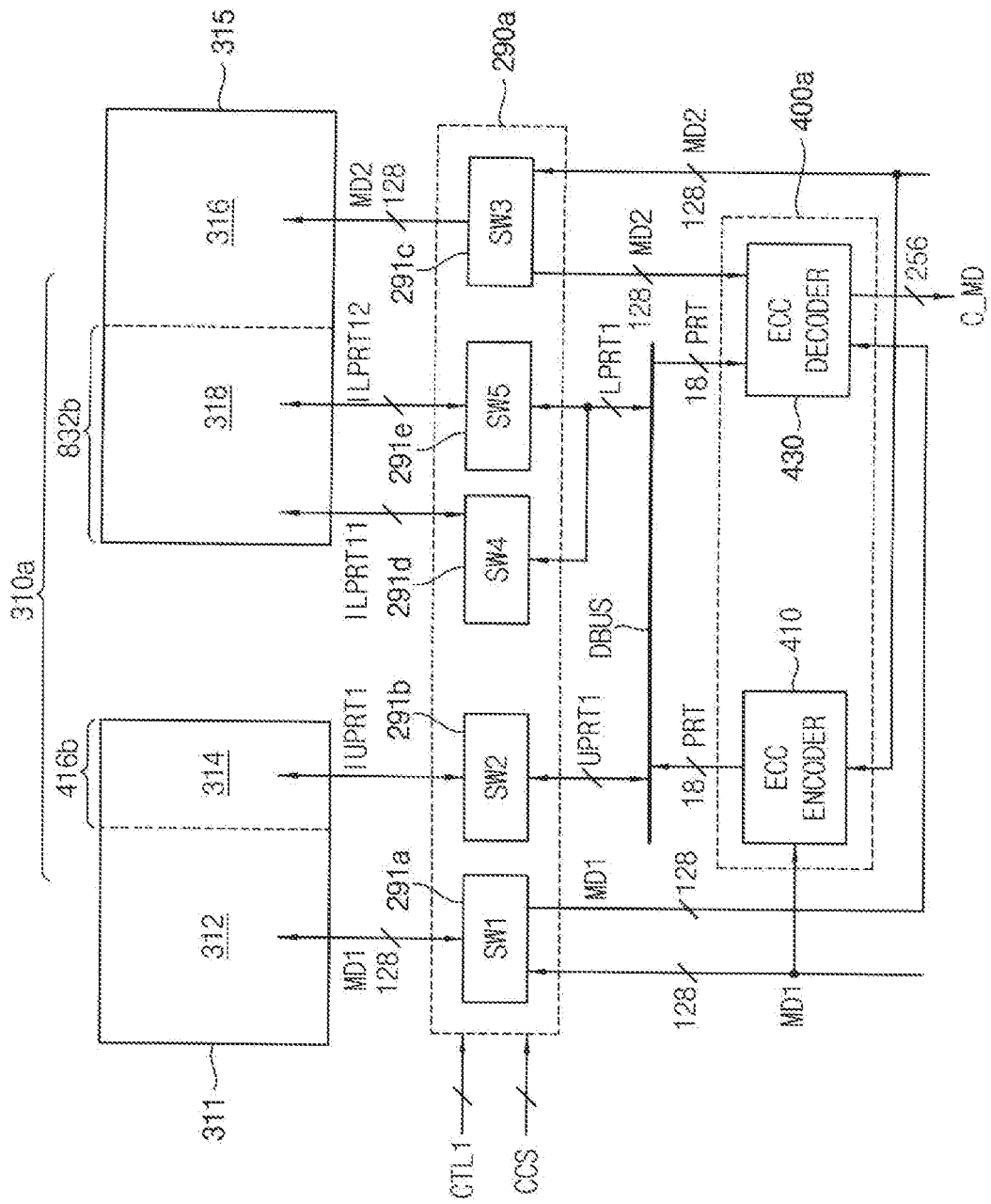
FIG. 4 is a block diagram illustrating an example of the first bank array, a first I/O gating circuit and a first ECC engine in the semiconductor memory device of FIG. 2.

FIG. 4 is a block diagram illustrating an example of the first bank array, a first I/O gating circuit and a first ECC engine in the semiconductor memory device of FIG. 2.

Referring to FIG. 4, a first bank array 310a includes a first sub array 311 and a second sub array 315 which are physically separated on a substrate of the semiconductor memory device 200.

The first sub array 311 includes a first normal cell region 312 to store data bits MD1 and a first parity cell region 314 to store parity bits. The second sub array 315 includes a second normal cell region 316 to store data bits MD2 and a second parity cell region 318 to store parity bits. In an embodiment, the first parity cell region 314 and the second parity cell region 318 have different data storage capacity for one word-line. In an embodiment, the first parity cell region 314 has a first storage capacity 416b that is half a second storage capacity 832b of the second parity cell region 318. For example, the first parity cell region 314 may store 416-bit parity bits for one word-line and the second parity cell region 318 may store 832-bit parity bits for one word-line.

The first I/O gating circuit 290a includes first through fifth switching circuits 291a~291e.

The first switching circuit 291a is connected between the first normal cell region 312 and the first ECC engine 400a, transfers the first data bits MD1 to the first normal cell region 312 in the write operation and transfers the first data bits MD1 to the first ECC engine 400a in the read operation. The second switching circuit 291b is connected between the first parity cell region 314 and the first ECC engine 400a, transfers upper parity bits UPRT1 to the first parity cell region 314 in the write operation and transfers internal upper parity bits IUPRT1 to the first ECC engine 400a in the read operation.

The third switching circuit 291c is connected between the second normal cell region 316 and the first ECC engine 400a, transfers the second data bits MD2 to the second normal cell region 316 in the write operation and transfers the second data bits MD2 to the first ECC engine 400a in the read operation. The fourth switching circuit 291d is connected between the second parity cell region 318 and the first ECC engine 400a, transfers some portion of lower parity bits LPRT1 to the second parity cell region 318 in the write operation and transfers first internal lower parity bits ILPRT11 to the first ECC engine 400a in the read operation. The fifth switching circuit 291e is connected between the second parity cell region 318 and the first ECC engine 400a, transfers another portion of the lower parity bits LPRT1 to the second parity cell region 318 in the write operation and transfers second internal lower parity bits ILPRT12 to the first ECC engine 400a in the read operation.

The first ECC engine 400a includes an ECC encoder 410 and an ECC decoder 430.

The ECC encoder 410, in the write operation, performs ECC encoding on data bits including the first data bits MD1 and the second data bits MD2 to generate parity bits PRT, and provides the parity bits PRT to the second switching circuit 291b, the fourth switching circuit 291d and the fifth switching circuit 291e via a data bus DBUS.

The ECC decoder 430, in the read operation, receives the parity bits PRT, the first data bits MD1 and the second data bits MD2, performs ECC decoding on the first data bits MD1 and the second data bits MD2 by using the parity bits PRT and corrects error bits of the first data bits MD1 and the second data bits MD2 to output a corrected main data C_MD.

When the first ECC engine 400a uses a double error correction (DEC) code, the ECC decoder 430 is capable of correcting two error bits in the first data bits MD1 and the second data bits MD2. In an exemplary embodiment, each of the first data bits MD1 and the second data bits MD2 includes 128 bits, the parity bits includes 18 bits, and each of the internal upper parity bits IUPRT1, the first internal lower parity bits ILPRT11 and the second internal lower parity bits ILPRT12 includes 8 bits. In this embodiment, each of the upper parity bits UPRT1 and the lower parity bits LPRT1 includes 18 bits.

Therefore, the second switching circuit 291b, the fourth switching circuit 291d and the fifth switching circuit 291e performs 18 to 24 demultiplexing in the write operation and performs 24 to 18 multiplexing in the read operation.

Figure 5:
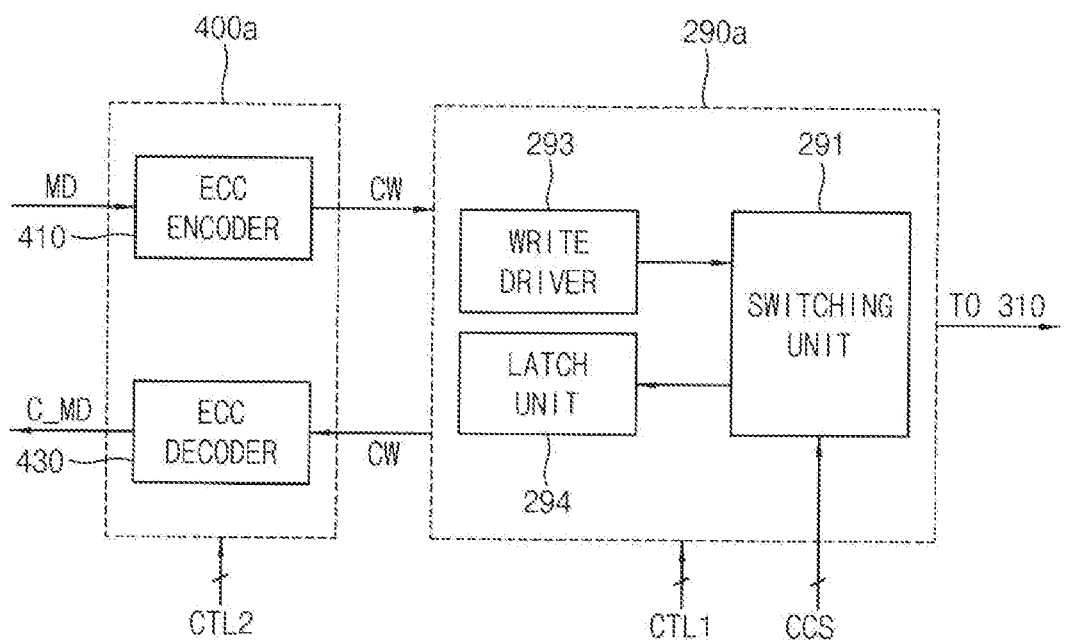
FIG. 5 illustrates the ECC engine and the I/O gating circuit connected to one bank array in the semiconductor memory device of FIG. 2.

FIG. 5 illustrates the ECC engine and the I/O gating circuit connected to one bank array in the semiconductor memory device of FIG. 2.

Referring to FIG. 5, the ECC engine 400a includes an ECC encoder 410 and an ECC decoder 430. The first I/O gating circuit 290a includes a switching unit 291, a write driver 293 and a latch unit 294. The switching unit 291 may include the switching circuits 291a~291e in FIG. 4.

The ECC encoder 410 performs an ECC encoding on data bits of the main data MD to generate the parity bits and provides the first I/O gating circuit 290a with the codeword CW including the parity bits and the main data MD in the write operation. The ECC decoder 430 performs an ECC decoding to correct error bits in the codeword CW read from the first bank array 310 using the parity bits in the read codeword CW and provides the corrected main data C_MD to the data I/O buffer 295 in the read operation. The first ECC engine 400a performs the ECC encoding and the ECC encoding in response to the second control signal CTL2. The switching circuits to transfer the parity bits, in the switching unit 291, performs 18 to 24 demultiplexing in the write operation and performs 24 to 18 multiplexing in the read operation in response to the column control signal CCS.

While the above shows an example of performing 18 to 24 demultiplexing in the write operation and performing 24 to 18 multiplexing in the read operation, the inventive concept is not limited thereto. For example, in an exemplary embodiment, the switching circuits perform M to N demultiplexing in the write operation and N to M multiplexing in the read operation, where M is less than N.

Figure 6:
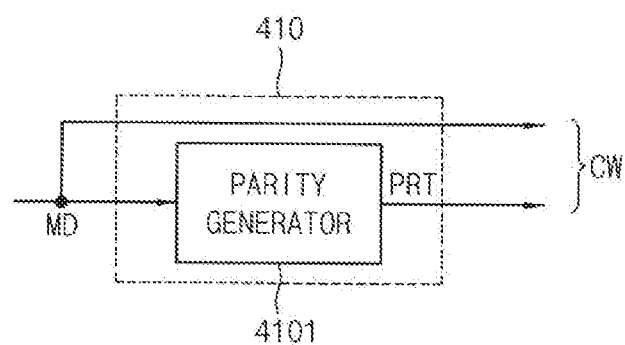
FIG. 6 illustrates the ECC encoder in the first ECC engine in FIG. 5 according to an exemplary embodiment of the inventive concept.

FIG. 6 illustrates the ECC encoder in the first ECC engine in FIG. 5 according to an exemplary embodiment of the inventive concept.

Referring to FIG. 6, the ECC encoder 410 includes a parity generator 4101. The parity generator 4101 performs an ECC encoding on the data bits in the main data MD to generate the parity bits PRT in the write operation and provides the first I/O gating circuit 290a with the codeword CW including the main data MD and the parity bits PRT.

Figure 7:
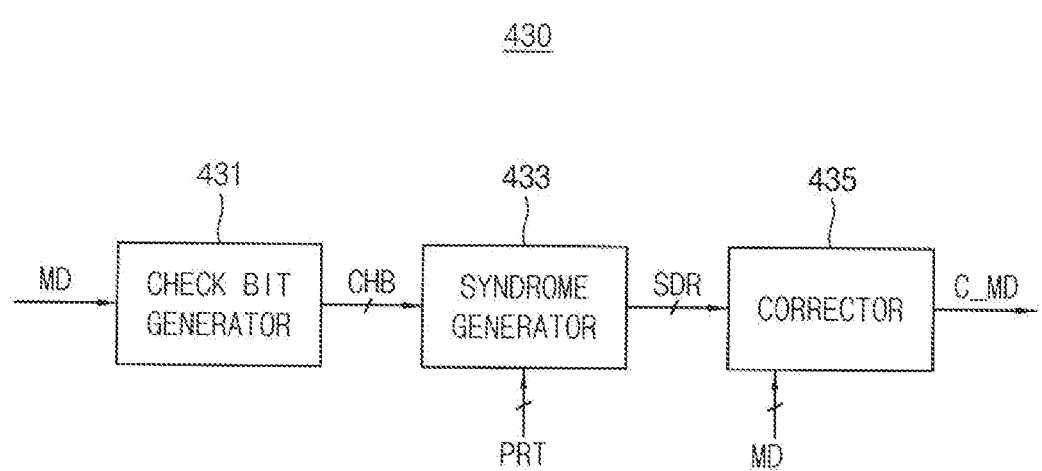
FIG. 7 illustrates the ECC decoder in the first ECC engine in FIG. 5 according to an exemplary embodiment of the inventive concept.

FIG. 7 illustrates the ECC decoder in the first ECC engine in FIG. 5 according to an exemplary embodiment of the inventive concept.

Referring to FIG. 7, the ECC decoder 430 includes a check bit generator 431, a syndrome generator 433 and a data corrector 435.

The check bit generator 431 generates check bits CHB based on a read data MD. The syndrome generator 433 generates a syndrome data SDR based on a comparison of the check bits CHB and the read parity bits PRT. The syndrome data SDR may indicate whether the read data MD includes at least one error bit and may also indicate a position of the error bit. The data corrector 435 may correct the error bit in the read data MD based on the syndrome data SDR, and may provide the corrected main data C_MD to the data I/O buffer 295.

Figure 8:
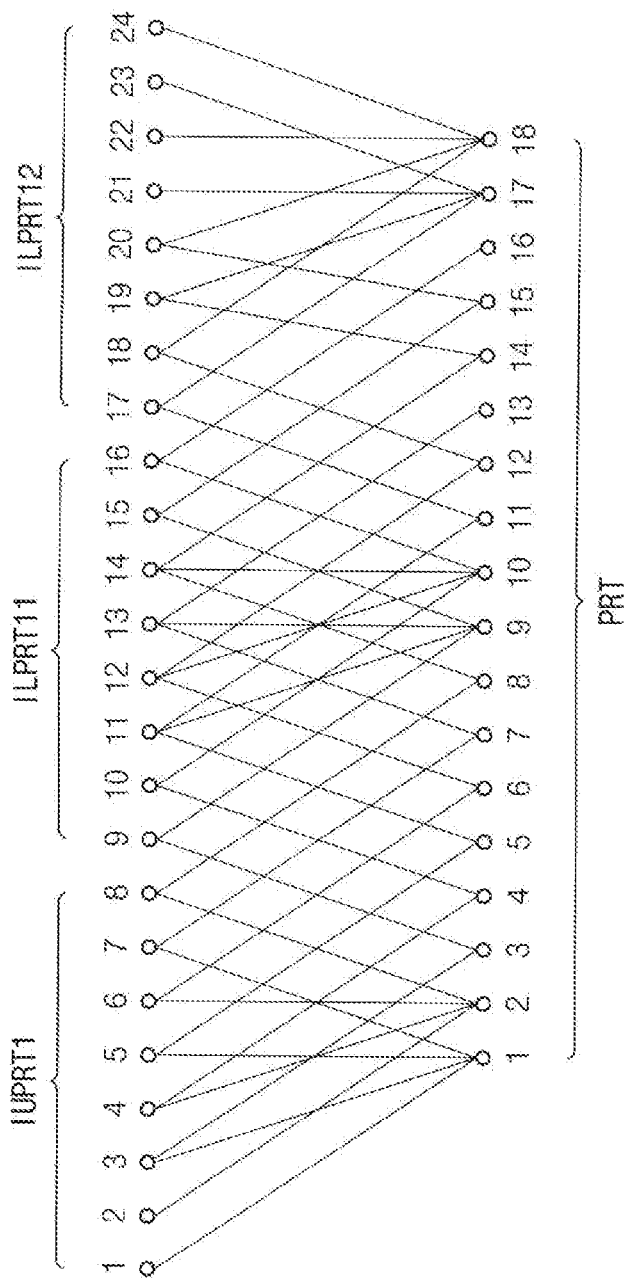
FIG. 8 illustrates operations of a second switching circuit, a fourth switching circuit and a fifth switching circuit in FIG. 4 according to an exemplary embodiment of the inventive concept.

FIG. 8 illustrates operations of the second switching circuit, the fourth switching circuit and the fifth switching circuit in FIG. 4 according to an exemplary embodiment of the inventive concept.

Referring to FIGS. 4 and 8, the second switching circuit 291b, the fourth switching circuit 291d and the fifth switching circuit 291e performs 18 to 24 demultiplexing on parity bits PRT in the write operation and performs 24 to 18 multiplexing on the internal parity bits IUPRT1, ILPRT11 and ILPRT12 in the read operation.

The second switching circuit 291b, the fourth switching circuit 291d and the fifth switching circuit 291e performs 18 to 24 demultiplexing on the parity bits PRT by masking a portion of the parity bits PRT in the write operation, and performs 24 to 18 multiplexing on the internal upper parity bits IUPRT1, the first internal lower parity bits ILPRT11 and the second internal lower parity bits ILPRT12 by repeatedly enabling a column selection signal by a predetermined unit for the internal upper parity bits IUPRT1, the first internal lower parity bits ILPRT11 and the second internal lower parity bits ILPRT12.

Figure 9:
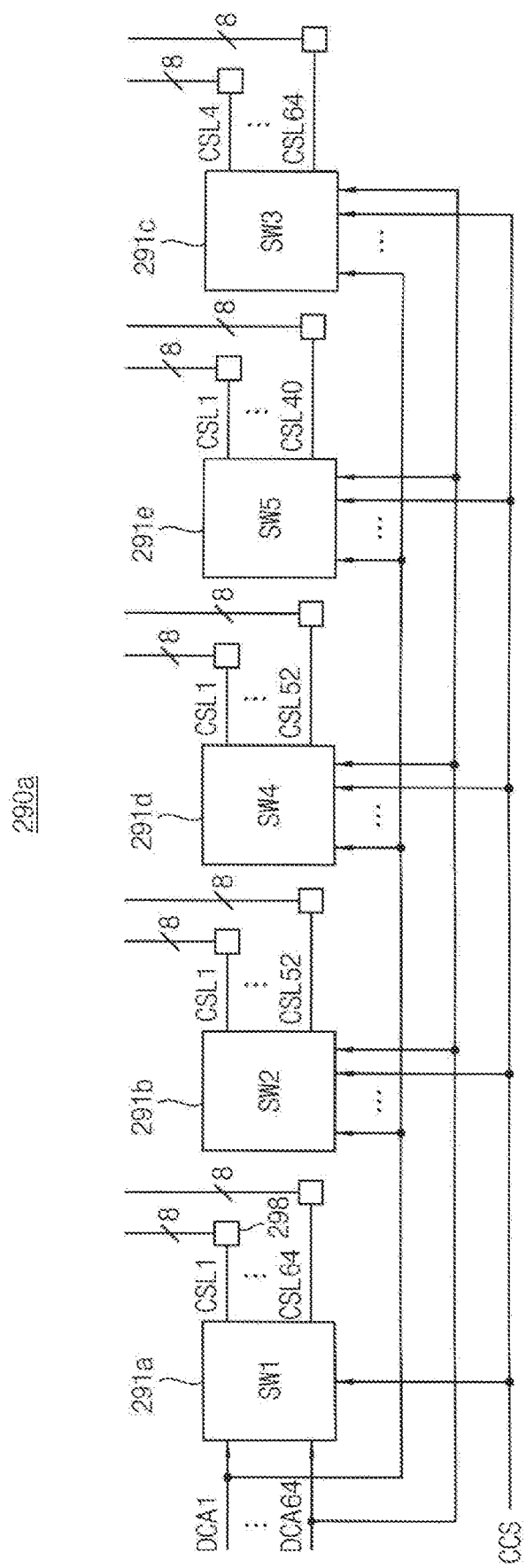
FIG. 9 illustrates operations of the first through fifth switching circuits in the first I/O gating circuit in FIG. 4.

FIG. 9 illustrates operations of the first through fifth switching circuits in the first I/O gating circuit in FIG. 4.

In FIG. 9, it is assumed that the first ECC engine 400a in FIG. 4 generates the parity bits including 2*(p+1) bits based on the data bits including $2^p$ bits, (where, p is a natural number equal to or greater than 8) and one page in the first normal cell region 312, the first parity cell region 314, the second normal cell region 316 and the second parity cell region 318 is accessed using first through q-th internal column addresses (where, $q=2^{p-2}$). Therefore, when p is 8, q is 64. The first through q-th internal column addresses DCA1~DCA64 may be provided from the first column decoder 270a in FIG. 2. The first column decoder 270a decodes the column address COL_ADDR to provide the first through q-th internal column addresses DCA1~DCA64.

Referring to FIG. 9, the first switching circuit 291a and the third switching circuit 291c associated with the data bits MD1 and MD2, respectively, turn on a corresponding column selection unit 298 in response to each of column selection signals CSL1~CSL64 when the first through 64-th internal column addresses DCA1~DCA64 are sequentially applied. The column selection unit 298 may be coupled to bit-lines corresponding to a burst length and may include switches corresponding to the burst length. In FIG. 9, when the burst length is 8, 8 bit-lines are simultaneously selected when the column selection unit 298 is turned on.

The second switching circuit 291b associated with the internal upper parity bits IUPRT1 may repeatedly enable a portion of the column selection signals to provide each of the column selection signals CSL1~CSL52 to a corresponding column selection unit when the first through 64-th internal column addresses DCA1~DCA64 are sequentially increased.

In an embodiment, the fourth switching circuit 291d associated with the first internal lower parity bits IUPRT11 repeatedly enables a portion of the column selection signals to provide each of the column selection signals CSL1~CSL52 to a corresponding column selection unit when the first through 64-th internal column addresses DCA1~DCA64 are sequentially increased. In an embodiment, the fifth switching circuit 291e associated with the second internal lower parity bits IUPRT12 repeatedly enables a portion of the column selection signals to provide each of the column selection signals CSL1~CSL40 to a corresponding column selection unit when the first through 64-th internal column addresses DCA1~DCA64 are sequentially increased.

FIGS. 10A through 10D illustrates a relationship between the internal column addresses and the column selection signals in each of the second, fourth and fifth switching circuits in FIG. 9.

In FIGS. 10A through 10D, a reference character VD denotes valid data.

Referring to FIGS. 9 through 10D, in the read operation of the semiconductor memory device 200, the fifth switching circuit 291e enables a same column selection signal by using $2^p/q$ (for example, four) internal column addresses of the first through q/2-th (first through 32-th) internal column addresses DCA1~DCA32, the fourth switching circuit 291d enables a same column selection signal by using $2^p/q$ internal column addresses of the ((q/2)+1)-th through ((q/2)+(q/4))-th (33-th through 48-th) internal column addresses DCA33~DCA48, and the second switching circuit 291b enables a same column selection signal by using $2^p/q$ internal column addresses of the ((q/2)+(q/4)+1)-th through q-th (49-th through 64-th) internal column addresses DCA49~DCA64. The fifth switching circuit 291e, the fourth switching circuit 291d and the second switching circuit 291b performs 24 to 18 multiplexing.

Each of the fifth switching circuit 291e, the fourth switching circuit 291d and the second switching circuit 291b enables the same column selection signal by using four internal column internal addresses, and sequentially selects 2 parity bits of 8 parity bits corresponding to the same column selection signal, in response to the column control signal CCS.

As described with reference to FIGS. 4, 8 and 9 through 10D, the control logic circuit 210 controls the first I/O gating circuit 290a to perform column access to the normal cell regions 312 and 316 according to a multiple of the burst length and to perform column access to the parity cell regions 314 and 318 according to a non-multiple of the burst length partially.

Figure 11:
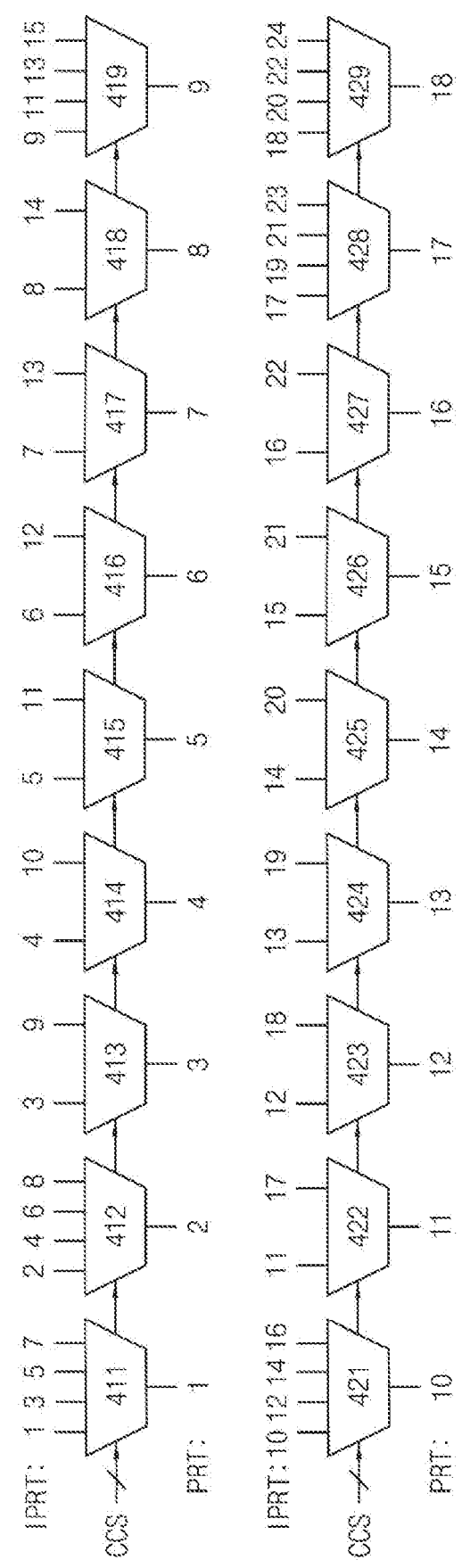
FIG. 11 illustrates a multiplexing operation performed by the second, the fourth and the fifth switching circuits in FIG. 9.

FIG. 11 illustrates a multiplexing operation performed by the second, the fourth and the fifth switching circuits in FIG. 9.

Referring to FIG. 11, the second, the fourth and the fifth switching circuits 291b, 291d and 291e include multiplexers 411~419 and 421~429. The multiplexers 411~419 and 421~429 may multiplex 24-bit internal parity bits IPRT to 18-bit parity bits PRT in response to the column selection signal CCS. Each of the multiplexers 411, 412, 419, 421, 428, and 429 performs 4 to 1 multiplexing and each of the other multiplexers performs 2 to 1 multiplexing.

Figure 12:
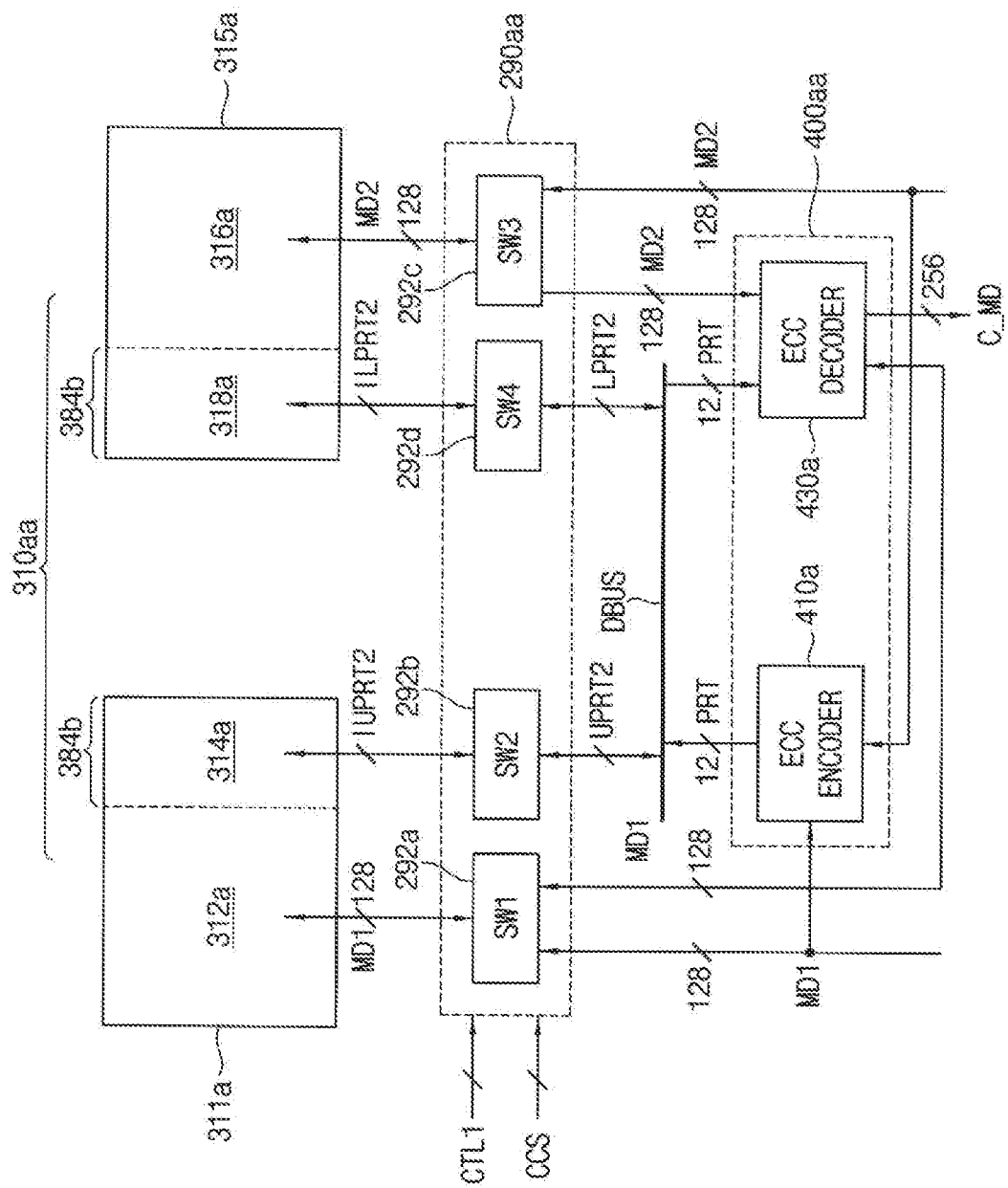
FIG. 12 is a block diagram illustrating another example of the first bank array, a first I/O gating circuit and a first ECC engine in the semiconductor memory device of FIG. 2.

FIG. 12 is a block diagram illustrating another example of the first bank array, a first I/O gating circuit and a first ECC engine in the semiconductor memory device of FIG. 2.

Referring to FIG. 12, a first bank array 310aa includes a first sub array 311a and a second sub array 315a which are physically separated on a substrate of the semiconductor memory device 200.

The first sub array 311a includes a first normal cell region 312a to store data bits MD1 and a first parity cell region 314a to store parity bits. The second sub array 315a includes a second normal cell region 316a to store data bits MD2 and a second parity cell region 318a to store parity bits. The first parity cell region 314a and the second parity cell region 318a may have the same data storage capacity for one word-line. In an embodiment, the first and second parity cell regions 414a and 318a have a same storage capacity 384b. In an embodiment, the first parity cell region 314a and the second parity cell region 318a respectively store 384-bit parity bits for one word-line.

The first I/O gating circuit 290aa includes first through fourth switching circuits 292a~292d. Operations of the first switching circuit 292a and the third switching circuit 292c are substantially the same as the operations of the first switching circuit 291a and the third switching circuit 291c in FIG. 4.

The second switching circuit 292b is connected between the first parity cell region 314a and the first ECC engine 400aa, transfers upper parity bits UPRT2 to the first parity cell region 314a in the write operation and transfers internal upper parity bits IUPRT2 to the first ECC engine 400aa in the read operation. The fourth switching circuit 292d is connected between the second parity cell region 318a and the first ECC engine 400aa, transfers lower parity bits LPRT2 to the second parity cell region 318a in the write operation and transfers internal lower parity bits ILPRT2 to the first ECC engine 400aa in the read operation.

The first ECC engine 400aa includes an ECC encoder 410a and an ECC decoder 430a.

When the ECC engine 400aa uses double error detection and a single error correction (DEDSEC) code, the ECC decoder 430a may detect two error bits and correct one error bit in the first data bits MD1 and the second data bits MD2. In an exemplary embodiment, each of the first data bits MD1 and the second data bits MD2 include 128 bits, the parity bits PRT include 12 bits, and each of the internal upper parity bits IUPRT2, and the internal lower parity bits ILPRT2 include 8 bits.

Therefore, the second switching circuit 292b and the fourth switching circuit 292d perform 12 to 16 demultiplexing in the write operation and perform 16 to 12 multiplexing in the read operation.

Figure 13:
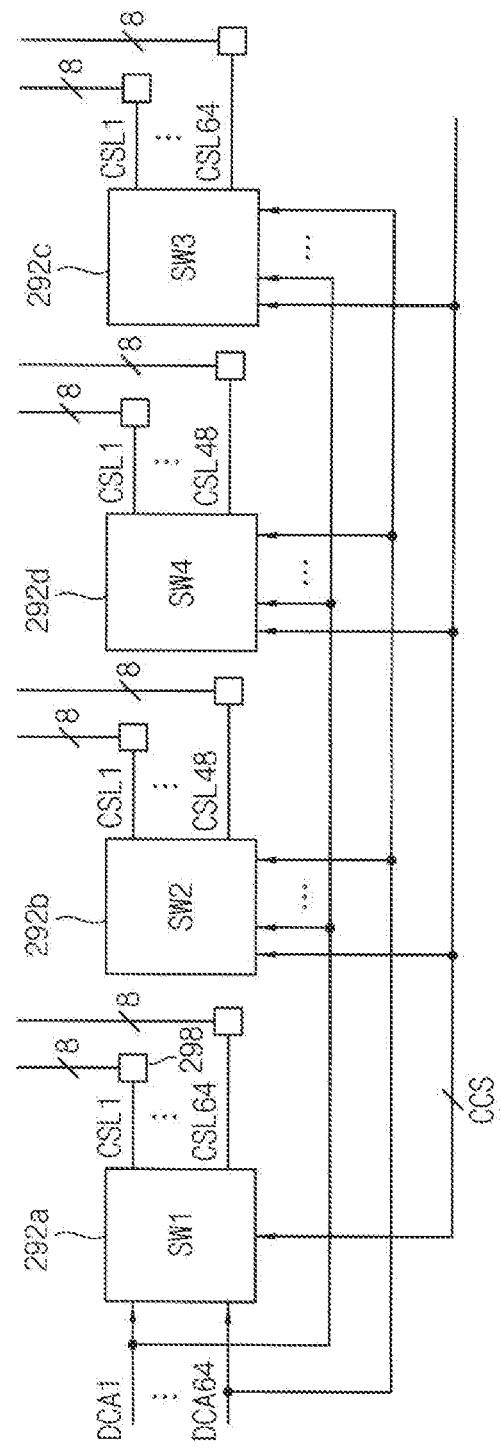
FIG. 13 illustrates operations of the first through fourth switching circuits in the first I/O gating circuit in FIG. 12.

FIG. 13 illustrates operations of the first through fourth switching circuits in the first I/O gating circuit in FIG. 12.

In FIG. 13, it is assumed that the first ECC engine 400aa in FIG. 12 generates the parity bits including $2*(p+1)$ bits based on the data bits including $2^p$ bits, (where, p is a natural number equal to or greater than 8) and one page in the first normal cell region 312a, the first parity cell region 314a, the second normal cell region 316a and the second parity cell region 318a is accessed using first through r-th internal column addresses (where, $r=2^{p-2}$). Therefore, when p is 8, r is 64. The first through r-th internal column addresses DCA1~DCA64 may be provided from the first column decoder 270a in FIG. 2. The first column decoder 270a decodes the column address COL_ADDR to provide the first through r-th internal column addresses DCA1~DCA64.

Referring to FIG. 13, the first switching circuit 292a and the third switching circuit 292c associated with the data bits MD1 and MD2, respectively, turn on a corresponding column selection unit 298 in response to each of column selection signals CSL1~CSL64 when the first through 64-th internal column addresses DCA1~DCA64 are sequentially increased. The column selection unit 298 may be coupled to bit-lines corresponding to a burst length and may include switches corresponding to the burst length. In FIG. 13, when the burst length is 8, 8 bit-lines are simultaneously selected when the column selection unit 298 is turned on.

The second switching circuit 292b associated with the internal upper parity bits IUPRT2 may repeatedly enable a portion of the column selection signals to provide each of the column selection signals CSL1~CSL48 to a corresponding column selection unit when the first through 64-th internal column addresses DCA1~DCA64 are sequentially increased. The fourth switching circuit 292d associated with the internal lower parity bits ILPRT2 may repeatedly enable a portion of the column selection signals to provide each of the column selection signals CSL1~CSL48 to a corresponding column selection unit when the first through 64-th internal column addresses DCA1~DCA64 are sequentially increased.

FIGS. 14A through 14D illustrates a relationship between the internal column addresses and the column selection signals in each of the second and fourth switching circuits in FIG. 13.

In FIGS. 14A through 14D, a reference character VD denotes valid data.

Referring to FIGS. 13 through 14D, in the read operation of the semiconductor memory device 200, the fourth switching circuit 292d enable a same column selection signal by using $2^{p-1}/r$ (for example, two) internal column addresses of the first through r/2-th (first through 32-th) internal column addresses DCA1~DCA32, and the second switching circuit 292b enables a same column selection signal by using $2^{p-1}/r$ internal column addresses of the ((r/2)+1)-th through r-th (33-th through 64-th) internal column addresses DCA33~DCA64. The second switching circuit 292b and the fourth switching circuit 292d perform 16 to 12 multiplexing.

Each of the second switching circuit 292b and the fourth switching circuit 292d enables the same column selection signal by two internal column internal addresses, and sequentially selects 4 parity bits of 8 parity bits corresponding to the same column selection signal, in response to the column control signal CCS.

As described with reference to FIGS. 12 through 14D, the control logic circuit 210 controls the first I/O gating circuit 290aa to perform column access to the first and second normal cell regions 312a and 316a according to a multiple of the burst length and to perform column access to the parity cell regions 314a and 318a according to a non-multiple of the burst length partially.

Hereinafter, exemplary embodiments are described for a semiconductor memory device conforming to the standard of a low-power double data rate 4 (LPDDR4) of the Joint Electron Device Engineering Council (JEDEC) with reference to FIGS. 15 through 18.

FIG. 15 is a perspective view of a stacked memory chip according to an exemplary embodiment of the inventive concept.

Referring to FIG. 15, a stacked memory chip 500 includes a base substrate 508 and a plurality of semiconductor dies 518 and 528 stacked on the base substrate 508. FIG. 15 illustrates a first semiconductor die 518 and a second semiconductor die 528 for convenience of illustration and three or more semiconductor dies may be packaged in the single memory chip 500.

The base substrate 508 may include a first chip input-output pad unit corresponding to a first channel region CHN_A and a second input-output pad unit corresponding to a second channel region CHN_B. The first chip input-output pad unit may include a first chip command-address pad unit 38, a first lower chip data pad unit 48 and a first upper chip data pad unit 58 that are to be connected to an external device. The second chip input-output pad unit may include a second chip command-address pad unit 39, a second lower chip data pad unit 49 and a second upper chip data pad unit 59 that are to be connected to the external device.

In an embodiment, the first chip command-address pad unit 38 includes a plurality of pads for receiving a first chip selection signal CSA, a first clock enable signal CKEA and first command-address signals CAA0~CAA5. In an embodiment, the first lower chip data pad unit 48 includes eight pads for communicating lower data DQA0~DQA7 of eight bits and the first upper chip data pad unit 58 includes eight pads for communicating upper data DQA8~DQA15 of eight bits.

In an embodiment, the second chip command-address pad unit 39 includes a plurality of pads for receiving a second chip selection signal CSB, a second clock enable signal CKEB and second command-address signals CAB0~CABS. In an embodiment, the second lower chip data pad unit 49 includes eight pads for communicating lower data DQB0~DQB7 of eight bits and the second upper chip data pad unit 59 includes eight pads for communicating upper data DQB8~DQB15 of eight bits.

In an embodiment, each of the first semiconductor die 518 and the second semiconductor die 528 include the first channel region CHN_A and the second channel region CHN_B that are operated independently of each other.

The first semiconductor die 518 includes a first die input-output pad unit 538, 548 and 558 corresponding to the first channel region CHN_A and a second die input-output pad unit 539, 549 and 559 corresponding to the second channel region CHN_B. The first die input-output pad unit includes a first die command-address pad unit 538 corresponding to the first chip command-address pad unit 38, a first lower die data pad unit 548 corresponding to the first lower chip data pad unit 48 and a first upper die data pad unit 558 corresponding to the first upper chip data pad unit 58. The second die input-output pad unit includes a second die command-address pad unit 539 corresponding to the second chip command-address pad unit 39, a second lower die data pad unit 549 corresponding to the second lower chip data pad unit 49 and a second upper die data pad unit 559 corresponding to the second upper chip data pad unit 59. Even though not illustrated in FIG. 15, the second semiconductor die 528 may include a first die input-output pad unit corresponding to the first channel region CHN_A and a second die input-output pad unit corresponding to the second channel region CHN_B of the same configuration as the first semiconductor die 518.

The die command-address pad units 538 and 539 of the first semiconductor die 518 and the die command-address pad units (not shown) of the second semiconductor die 528 may be connected commonly to the chip command-address pad units 38 and 39. The lower die data pad units 548 and 549 of the first semiconductor die 518 may be electrically connected to the lower chip data pad units 48 and 49 and the upper die data pad units 558 and 559 of the first semiconductor die 518 may be electrically disconnected from the upper chip data pad units 58 and 59. The upper die data pad units (not shown) of the second semiconductor die 518 may be electrically connected to the upper chip data pad units 58 and 59 and the lower die data pad units (not shown) of the second semiconductor die 308 may be electrically disconnected from the lower chip data pad units 48 and 49.

As illustrated in FIG. 15, the first semiconductor die 518 and the second semiconductor die 528 may be connected to the lower chip data pad units 48 and 49 and the upper chip data pad units 58 and 59 through bonding wires, respectively. In addition, the first semiconductor die 518 and the second semiconductor die 528 may be connected commonly to the chip command-address pad units 38 and 39 through the bonding wires. In other exemplary embodiments, the first semiconductor die 518 and the second semiconductor die 528 may be connected commonly to the chip command-address pad units 38 and 39 using through-silicon vias (TSV).

FIG. 16 is a diagram for describing an addressing scheme of the stacked memory chip of FIG. 15.

Referring to FIG. 16, each semiconductor die may have the memory capacity or the memory density of 4 Gb, 8 Gb or 16 Gb, and each channel may have the memory density of 2 Gb, 4 Gb or 8 Gb when each semiconductor die includes two channels. Each channel may include eight memory banks regardless of the memory density, and the bank address may be determined using the three address bits BA0, BA1 and BA2 regardless of the memory density. When the data width or the number of the data pads per channel is sixteen, the number of the address bits for indicating the row address may be increased according to the increase of the memory density. For example, there may be 14 row address bits R0-R13 when the memory density per die is 4 Gb, 15 row address bits R0-R14 when the memory density per die is 8 Gb, and 16 row address bits when the memory density per die is 8 Gb. In an embodiment, the number of the address bits C0~C9 for indicating the column address is fixed.

Figure 18:
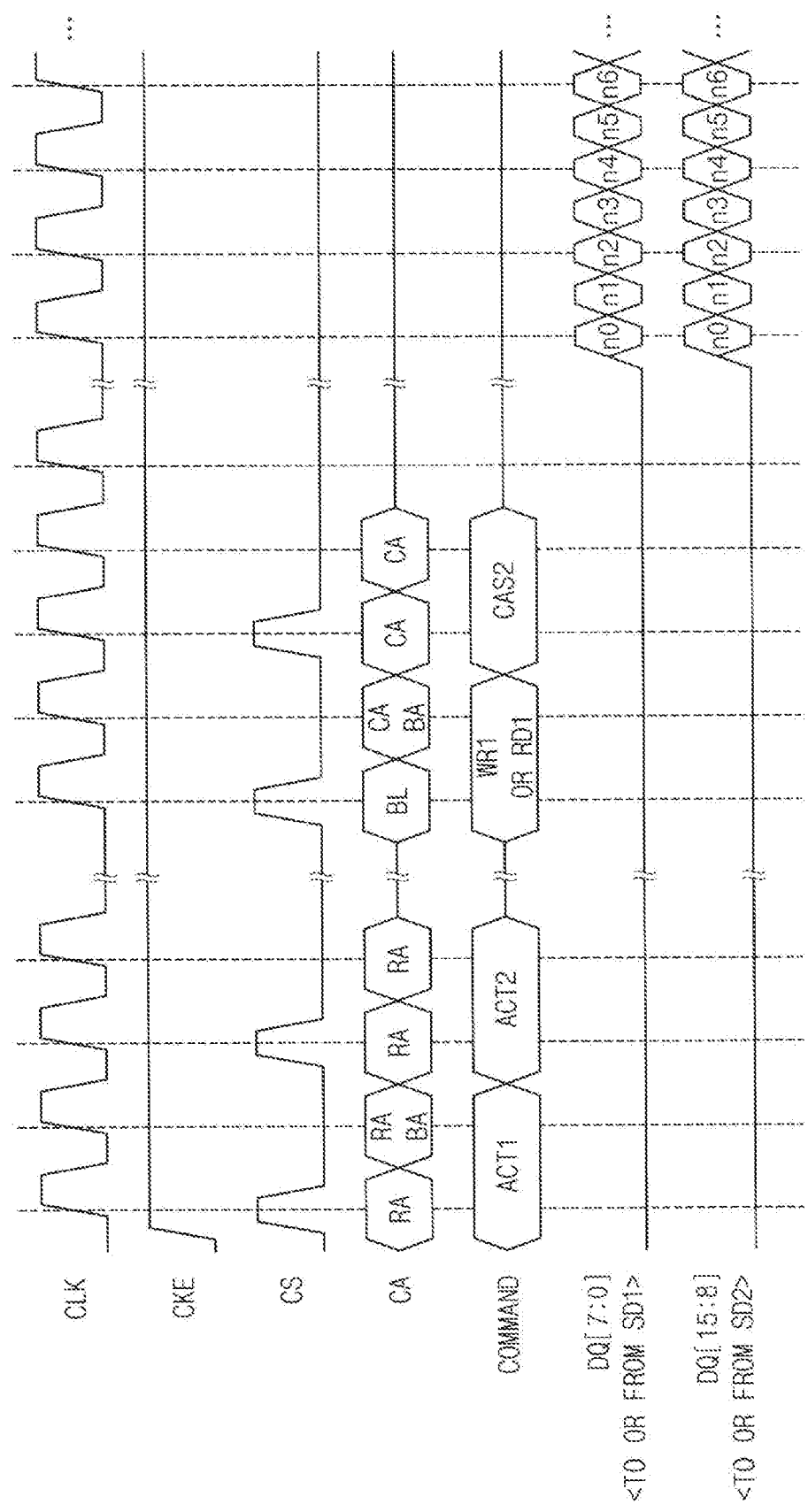
FIG. 18 is a timing diagram illustrating an operation of the stacked memory chip of FIG. 15.

FIG. 17 is a diagram illustrating a portion of commands in the stacked memory chip of FIG. 15, and FIG. 18 is a timing diagram illustrating an operation of the stacked memory chip of FIG. 15.

FIG. 17 illustrates combinations of the chip selection signal CS and the command-address signals CA0~CA5 representing a first active command ACT1, a second active command ACT2, a first write command WR1, a first read command RD1 and a second CA5 command CAS2. H indicates the logic high level, L indicates the logic low level, R0~R15 indicate bits of the row address RA, BA0~BA2 indicate bits of the bank address BA, V indicates any one of the logic low level and the logic high level, BL indicates the burst length, C2~C8 indicate bits of the column address CA, AP indicates an auto precharge. R1 indicates a first rising edge of the clock signal CK and R2 indicates a second rising edge of the clock signal CK.

FIG. 18 illustrates a sequence corresponding to a burst read operation or a burst write operation. An active command may be represented by a combination of a first active command ACT1 and a second active command ACT2, a read command may be represented by a first read command RD1 and a second CAS command CAS2, and a write command may be represented by a first write command WR1 and a second CAS command CAS2. As such, the stacked memory chip 500 of FIG. 15 may receive the command and the address during a plurality of clock cycles (e.g., four clock cycles). The clock enable signal CKE may maintain the logic high level while the command is input to the memory chip 500.

According to an exemplary embodiment, the lower die data pad unit of the first semiconductor die 518 is electrically connected to the lower chip data pad unit to communicate the lower data DQ[7:0] and the upper die data pad unit of the first semiconductor die 518 is electrically disconnected from the upper chip data pad unit. According to an exemplary embodiment, the upper die data pad unit of the second semiconductor die 528 is electrically connected to the upper chip data pad unit to communicate the upper data DQ[15:8] and the lower die data pad unit of the second semiconductor die 528 is electrically disconnected from the lower chip data pad unit. As such, the input-output load may be reduced by selectively connecting each of the stacked semiconductor dies to one of the lower chip data pad unit and the upper chip data pad unit, thereby increasing the operation speed and decreasing the power consumption.

According to an exemplary embodiment of the inventive concept, the data pad unit of each of the first semiconductor die (SD1) 518 and the second semiconductor die (SD2) 528 are electrically connected to the chip data pad unit to communicate the data DQ[15:0]. In this case, each of the first semiconductor die 518 and the second semiconductor die 528 may be configured as in FIG. 4 or in FIG. 12, may include a bank array including a first sub array and a second sub array and may perform a column access to a first parity cell region of the first sub array and a second parity cell region of the second sub array according to a non-multiple of the burst length partially.

Figure 19:
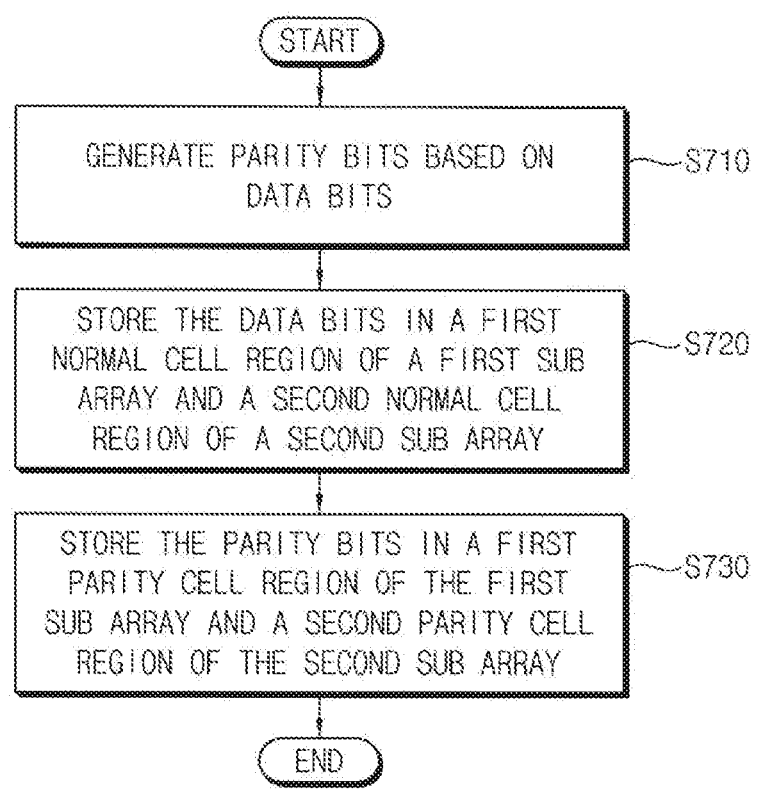
FIG. 19 is a flow chart illustrating a method of operating a semiconductor memory device according to an exemplary embodiment of the inventive concept.

FIG. 19 is a flow chart illustrating a method of operating a semiconductor memory device according to an exemplary embodiment of the inventive concept.

Referring to FIGS. 2 through 14D and 19, in a method of operating a semiconductor memory device 200, where the semiconductor memory device 200 includes a memory cell array 300 having a plurality of bank arrays 310~380, each of the bank arrays 310~380 includes a first sub array 311 and a second sub array 315, and each of the first sub array 311 and the second sub array 315 includes normal cell regions 312 and 316 to store data bits MD and parity cell regions 314 and 318 to store parity bits PRT associated with the data bits MD, an ECC encoder 410 in a first ECC engine 400a generates parity bits based on the data bits MD (S710).

A first I/O gating circuit 290a stores the data bits MD in a first normal cell region 312 of the first sub array 311 and in a second normal cell region 316 of a second sub array 315 (S720). While the data bits MD are being stored in the first normal cell region 312 and the second normal cell region 316, the first I/O gating circuit 290a stores parity bits PRT in a first parity cell region 314 of the first sub array 311 and in a second parity cell region 318 of the second sub array 315 (S730). In this case, a column access to the normal cell regions 312 and 316 are performed according to a multiple of the burst length and a column access to the parity cell regions 314 and 318 are performed according to a non-multiple of the burst length partially. As described with reference to FIGS. 4 and 8 through 14D, the switching circuits transferring the parity bits, in the first I/O gating circuit 290a perform 24 to 18 demultiplexing, 18 to 24 multiplexing, 12 to 16 demultiplexing or 16 to 12 multiplexing.

Therefore, according to exemplary embodiments, when an ECC using parity bits whose number does not conform to a multiple of the burst length is employed, the semiconductor memory device may enhance performance and reliance by performing an ECC encoding and an ECC decoding using the ECC.

Figure 20:
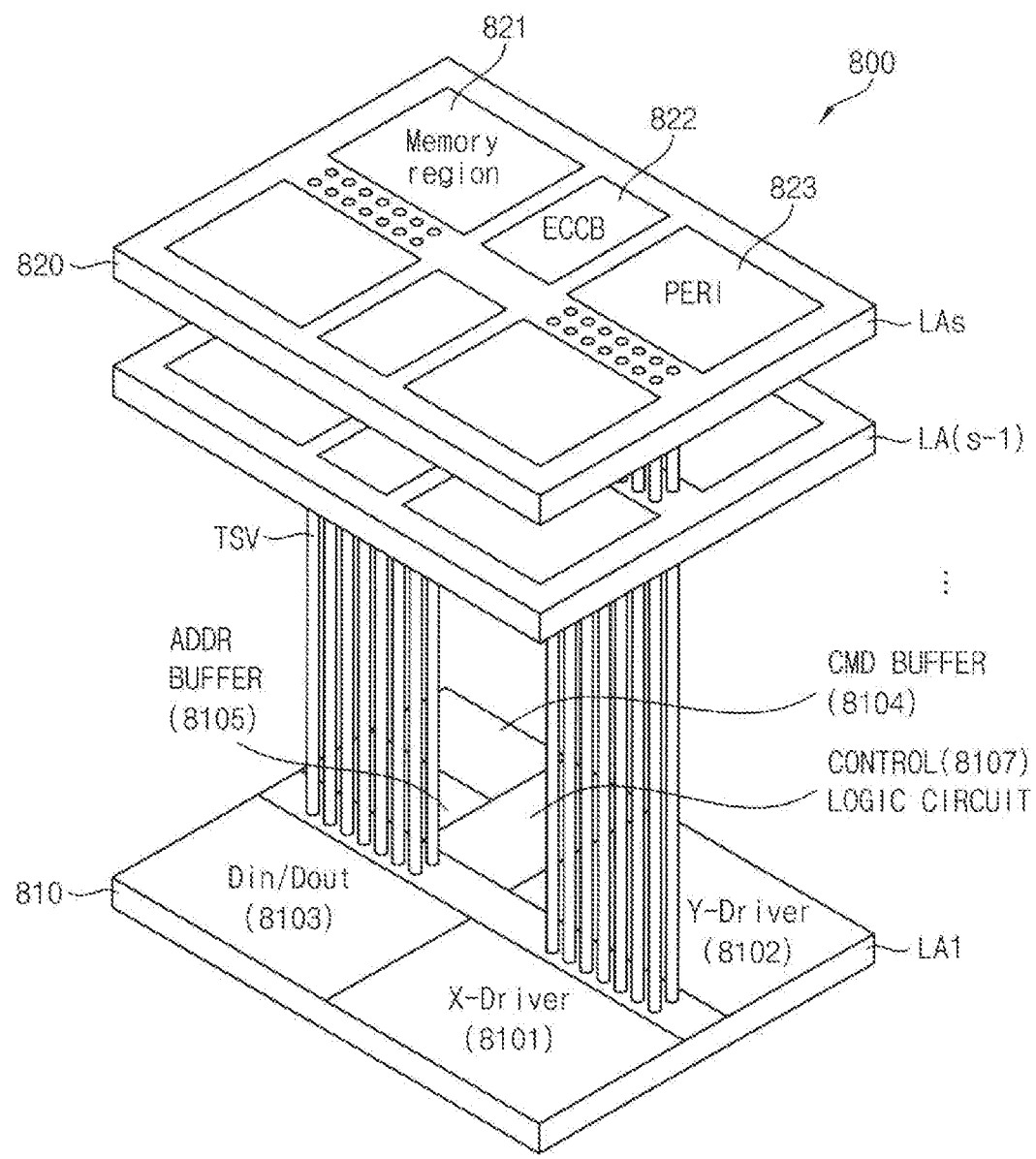
FIG. 20 is a structural diagram illustrating a semiconductor memory device according to an exemplary embodiment of the inventive concept.

FIG. 20 is a structural diagram illustrating a semiconductor memory device according to an exemplary embodiment of the inventive concept.

Referring to FIG. 20, a semiconductor memory device 800 includes first through s-th semiconductor integrated circuit layers LA1 through LAs (s is a natural number greater than two), in which the lowest first semiconductor integrated circuit layer LA1 is assumed to be an interface or control chip and the other semiconductor integrated circuit layers LA2 through LAs are assumed to be slave chips including core memory chips. The first through s-th semiconductor integrated circuit layers LA1 through LAs may transmit and receive signals therebetween through through-silicon-vias (TSVs). The lowest first semiconductor integrated circuit layer LA1 acting as the interface or control chip may communicate with an external memory controller through a conductive structure formed on an external surface. A description will be made regarding structure and an operation of the semiconductor memory device 800 by mainly using the first semiconductor integrated circuit layer LA1 or 810 as the interface or control chip and the s-th semiconductor integrated circuit layer LAs or 820 as the slave chip.

The first semiconductor integrated circuit layer 810 may include various peripheral circuits for driving a memory region 821 provided in the s-th semiconductor integrated circuit layer 820. For example, the first semiconductor integrated circuit layer 810 may include a row (X)-driver 8101 for driving word-lines of a memory, a column (Y)-driver 8102 for driving bit-lines of the memory, a data input/output unit (Din/Dout) 8103 for controlling input/output of data, a command buffer (CMD) 8104 for receiving a command CMD from outside and buffering the command CMD, and an address buffer (ADDR) 8105 for receiving an address and buffering the address.

In an embodiment, the first semiconductor integrated circuit layer 810 further includes a control logic circuit 8107. The control logic circuit 8107 may access the memory region 821 based on the command and the address from a memory controller. The s-th semiconductor integrated circuit layer 820 includes the memory region 821, an ECC engine block 822 that performs ECC encoding and ECC decoding on data of the memory region 821, and a peripheral region 823 in which peripheral circuits such as a row decoder, a column decoder, and a bit-line sense amplifier are disposed for writing/reading data in the memory region 821.

As described with reference to FIGS. 2 through 14D and 19, an I/O gating circuit may be connected between the memory region 821 and the ECC engine block 822. The I/O gating circuit may perform a column access to a normal cell region to store data bits, in a bank array in the memory region 821 according to a multiple of a burst length and may perform a column access to a parity cell region to store parity bits, in the bank array in the memory region 821 according to non-multiple of the burst length partially. Therefore, when an ECC using parity bits whose number does not conform to a multiple of the burst length is employed, the semiconductor memory device 800 may enhance performance and reliance by performing an ECC encoding and an ECC decoding using the ECC.

In an exemplary embodiment of the inventive concept, a three dimensional (3D) memory array is provided in the semiconductor memory device 800. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679, 133; 8,553,466; 8,654,587; 8,559,235; and US Pat. Pub. No. 2011/0233648.

Figure 21:
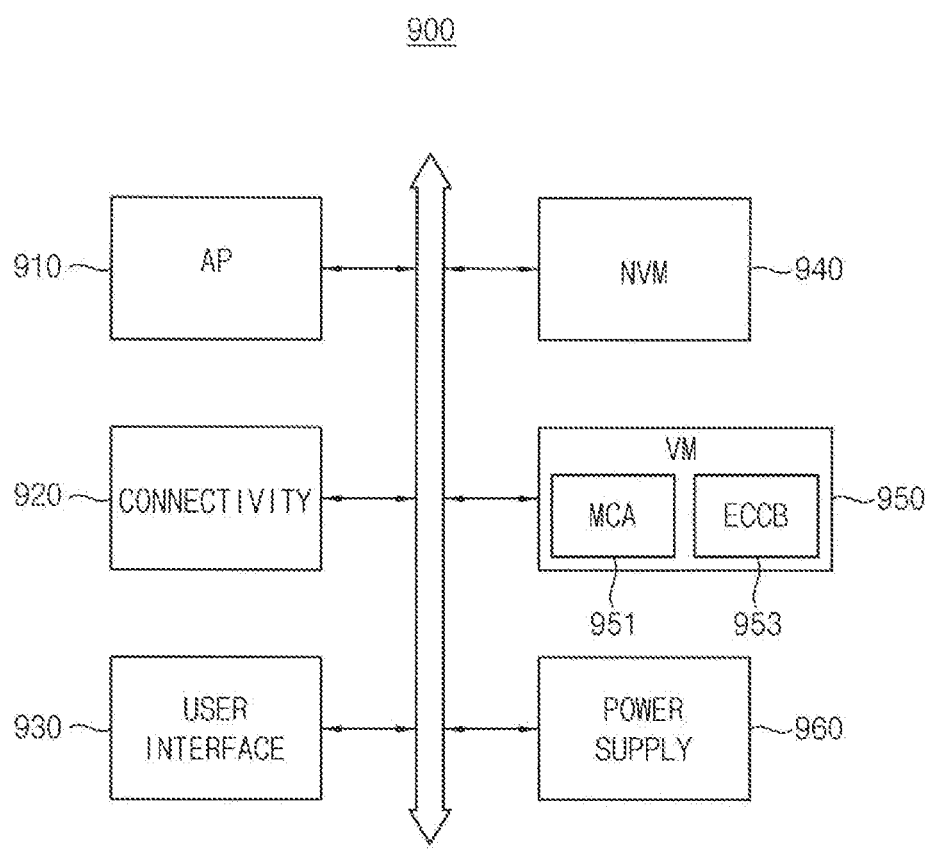
FIG. 21 is a block diagram illustrating a mobile system including the semiconductor memory device according to an exemplary embodiment of the inventive concept.

FIG. 21 is a block diagram illustrating a mobile system including the semiconductor memory device according to an exemplary embodiment of the inventive concept.

Referring to FIG. 21, a mobile system 900 includes an application processor 910, a connectivity module 920, a volatile memory device 950, a nonvolatile memory device 940, a user interface 930 and a power supply 960.

The application processor 910 may execute applications, such as a web browser, a game application, a video player, etc. The connectivity module 920 may perform wired or wireless communication with an external device. The volatile memory device 950 may store data processed by the application processor 910 or operate as a working memory. The volatile memory device 950 may employ the semiconductor memory device 200 of FIG. 2. The volatile memory device 950 includes a memory cell array 951 and an ECC engine block 953.

The nonvolatile memory device 940 may store a boot image for booting the mobile device 900. The user interface 930 may include at least one input device, such as a keypad, a touch screen, etc., and at least one output device, such as a speaker, a display device, etc. The power supply 960 may supply a power supply voltage to the mobile system 900.

In some embodiments, the mobile system 900 and/or components of the mobile device 900 may be packaged in various forms.

Aspects of the present inventive concept may be applied to systems using semiconductor memory devices. For example, aspects of the present inventive concept may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, or a navigation system.

The foregoing is illustrative of exemplary embodiments of the inventive concept and is not to be construed as limiting thereof. Although a few exemplary embodiments of the inventive concept have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. A semiconductor memory device comprising:
a memory cell array including a plurality of bank arrays, wherein each of the bank arrays includes a first sub array and a second sub array, the first sub array includes a first normal cell region and a first parity cell region, and the second sub array includes a second normal cell region and a second parity cell region, the first and second normal cell regions together storing data bits and the first and second parity cell regions together storing N parity bits associated with the data bits;
an error correction code (ECC) engine configured to generate M parity bits based on the data bits and configured to correct at least one error bit of the data bits using the M parity bits;
an input/output (I/O) gating circuit connected between the ECC engine and the memory cell array; and
a control logic circuit configured to control access to the memory cell array based on a command and an address,
wherein the control logic circuit is configured to control the I/O gating circuit to perform column access to the normal cell region and control the I/O gating circuit to perform one of M to N demultiplexing on the M parity bits and N to M multiplexing on the N parity bits to perform column access to the parity cell regions, in response to the address,
where M is less than N.

2. The semiconductor memory device of claim 1, wherein a first data storage capacity of the first normal cell region is different from a second data storage capacity of the first parity cell region.

3. The semiconductor memory device of claim 1, wherein a first data storage capacity of the first parity cell region of the first sub array is different from a second data storage capacity of the second parity cell region of the second sub array.

4. The semiconductor memory device of claim 3, wherein the ECC engine is configured to use a double error correction (DEC) code.

5. The semiconductor memory device of claim 3, wherein the I/O gating circuit comprises:
a first switching circuit connected to the first normal cell region of the first sub array;
a second switching circuit connected to the first parity cell region of the first sub array;
a third switching circuit connected to the second normal cell region of the second sub array; and
a fourth switching circuit and a fifth switching circuit connected to the second parity cell region of the second sub array.

6. The semiconductor memory device of claim 5, wherein in a write operation of the semiconductor memory device,
the ECC engine is configured to generate the M parity bits including $2*(p+1)$ bits based on the data bits including $2^p$ bits, where p is a natural number equal to or greater than 8; and
the second switching circuit, the fourth switching circuit and the fifth switching circuit are configured to perform 2*(p+1) to 3p demultiplexing on the M parity bits, in response to a column control signal from the control logic circuit.

7. The semiconductor memory device of claim 6, wherein in a read operation of the semiconductor memory device,
the second switching circuit, the fourth switching circuit and the fifth switching circuit are configured to perform 3p to 2*(p+1) multiplexing on the N parity bits together stored in the first parity cell region and the second parity cell region, in response to the column control signal.

8. The semiconductor memory device of claim 5, wherein in a write operating of the semiconductor memory device,
the ECC engine is configured to generate the M parity bits including 2*(p+1) bits based on the data bits including $2^p$ bits, where p is a natural number equal to or greater than 8; and
the I/O gating circuit is configured to access one page in the first normal cell region, the first parity cell region, the second normal cell region and the second parity cell region using first through q-th internal column addresses, where $q=2^{p-2}$.

9. The semiconductor memory device of claim 8, wherein in a read operation of the semiconductor memory device,
the fifth switching circuit is configured to enable a same column selection signal by using $2^p/q$ internal column addresses of the first through q/2-th internal column addresses;
the fourth switching circuit is configured to enable a same column selection signal by using $2^p/q$ internal column addresses of the ((q/2)+1)-th through ((q/2)+(q/4))-th internal column addresses; and
the second switching circuit is configured to enable a same column selection signal by using $2^p/q$ internal column addresses of the ((q/2)+(q/4)+1)-th through q-th internal column addresses.

10. The semiconductor memory device of claim 1, wherein a first data storage capacity of the first parity cell region of the first sub array is the same as a second data storage capacity of the second parity cell region of the second sub array.

11. The semiconductor memory device of claim 10, wherein the ECC engine is configured to use a double error detection and single error correction (DEDSEC) code.

12. The semiconductor memory device of claim 10, wherein the I/O gating circuit comprises:
a first switching circuit connected to the first normal cell region of the first sub array;
a second switching circuit connected to the first parity cell region of the first sub array;
a third switching circuit connected to the second normal cell region of the second sub array; and
a fourth switching circuit connected to the second parity cell region of the second sub array.

13. The semiconductor memory device of claim 12, wherein in a write operation of the semiconductor memory device,
the ECC engine is configured to generate the M parity bits including 2*(p−1) bits based on the data bits including $2^p$ bits, where p is a natural number equal to or greater than 8; and
the second switching circuit and the fourth switching circuit are configured to perform 2*(p−2) to 2p demultiplexing on the M parity bits, in response to a column control signal from the control logic circuit.

14. The semiconductor memory device of claim 13, wherein in a read operation of the semiconductor memory device,
the second switching circuit and the fourth switching circuit are configured to perform 2p to 2*(p−2) multiplexing on the N parity bits together stored in the first parity cell region and the second parity cell region, in response to the column control signal.

15. The semiconductor memory device of claim 12, wherein in a write operation of the semiconductor memory device,
the ECC engine is configured to generate the M parity bits including 2*(p−1) bits based on the data bits including $2^p$ bits, where p is a natural number equal to or greater than 8; and
the I/O gating circuit is configured to access one page in the first normal cell region, the first parity cell region, the second normal cell region and the second parity cell region by using first through r-th internal column addresses, where $r=2^{p-2}$.

16. The semiconductor memory device of claim 15, wherein in a read operation of the semiconductor memory device,
the fourth switching circuit is configured to enable a same column selection signal by using $2^p/r$ internal column addresses of the first through r/2-th internal column addresses; and
the second switching circuit is configured to enable a same column selection signal by using $2^p/r$ internal column addresses of the ((r/2)+1)-th through r-th internal column addresses.

17. The semiconductor memory device of claim 1, wherein
wherein the control logic circuit is configured to control the ECC engine to perform column access to the parity cell region;
each of the bank arrays includes a plurality of dynamic memory cells coupled to a plurality of word-lines and a plurality of bit-lines; and
the semiconductor memory device conforms to low-power double data rate 4 (LPDDR4) standard.

18. A memory system comprising:
at least one semiconductor memory device; and
a memory controller configured to control the at least one semiconductor memory device, wherein the at least one semiconductor memory device comprises:
a memory cell array including a plurality of bank arrays, wherein each of the bank arrays includes a first sub array and a second sub array, the first sub array includes a first normal cell re ion and a first parity cell region, and the second sub array includes a second normal cell region and a second parity cell region, the first and second normal cell regions together storing data bits and the first and second parity cell regions together storing N parity bits associated with the data bits;
an error correction code (ECC) engine configured to generate M parity bits based on the data bits and configured to correct at least one error bit of the data bits using the M parity bits;
an input/output (I/O) gating circuit connected between the ECC engine and the memory cell array; and
a control logic circuit configured to control an access to the memory cell array based on a command and an address from the memory controller,
wherein the control logic circuit is configured to control the I/O gating circuit to perform column access to the normal cell region and control the I/O gating circuit to perform one of M to N demultiplexing on the M parity bits and N to M multiplexing on the N parity bits to perform column access to the parity cell regions, in response to the address, where M is less than N.

19. The memory system of claim 18, wherein:

a first data storage capacity of the first normal cell region is different from a second data storage capacity of the first parity cell region;

a third data storage capacity of the first parity cell region of the first sub array is different from a fourth data storage capacity of the second parity cell region of the second sub array; and the ECC engine is configured to use a double error correction (DEC) code.

20. A method of operating a semiconductor memory device including a memory cell array having a plurality of bank arrays, wherein each of the bank arrays includes a first sub array and a second sub array, the first sub array includes a first normal cell region and a first parity cell region, and the second sub array includes a second normal cell region and a second parity cell region, the method comprising:

generating M parity bits based on a plurality of data bits;

storing the data bits together in the first normal cell region of the first sub array and the second normal cell region of the second sub array;

performing M to N demultiplexing on the M parity to generate N parity bits;

storing the N parity bits together in the first parity cell region of the first sub array and the second parity cell region of the second sub array while the data bits are being stored in the first normal cell region and the second normal cell region, where M is less than N.

* * * * *